US012716940B2

(12) United States Patent
Chang

(10) Patent No.: US 12,716,940 B2
(45) Date of Patent: Aug. 25, 2026

(54) WAFER PROBING APPARATUS WITH PROBE CARD POSITIONING MODULE

(71) Applicant: Chien Wen Chang, Taoyuan City (TW)

(72) Inventor: Chien Wen Chang, Taoyuan City (TW)

( * ) Notice: Subject to any disclaimer, the term of this patent is extended or adjusted under 35 U.S.C. 154(b) by 155 days.

(21) Appl. No.: 18/758,197

(22) Filed: Jun. 28, 2024

(65) Prior Publication Data

US 2026/0002987 A1 Jan. 1, 2026

(51) Int. Cl.
*G01R 31/28* (2006.01)
*G01R 1/073* (2006.01)

(52) U.S. Cl.
CPC ..... *G01R 31/2887* (2013.01); *G01R 1/07342* (2013.01)

(58) Field of Classification Search
CPC ........................ G01R 31/2887; G01R 1/07342
See application file for complete search history.

(56) References Cited

U.S. PATENT DOCUMENTS

| | | | | |
|---|---|---|---|---|
| 7,057,408 | B2 * | 6/2006 | Schneidewind ... | G01R 31/2886 324/750.19 |
| 10,365,323 | B2 * | 7/2019 | Andrews ............ | G01R 31/2891 |
| 11,307,246 | B2 * | 4/2022 | Lou .................... | G01R 31/2887 |
| 11,796,566 | B2 * | 10/2023 | Fu ...................... | G01R 1/07342 |
| 2020/0049762 | A1 * | 2/2020 | Ota ...................... | G01R 1/0675 |

* cited by examiner

*Primary Examiner* — Reena Aurora

(57) ABSTRACT

A wafer probing apparatus is provided with a wafer probe station including a wafer chuck and a chuck movement device disposed under the wafer chuck and configured to move the wafer chuck in which a wafer is adhered to the wafer chuck; a lifting mechanism disposed close to the wafer probe station; a support frame provided with the lifting mechanism; at least one probe card positioning module disposed on the support frame, each probe card positioning module including at least one needle alignment device, each needle alignment device having at least one probe card with at least one probe needle; and a mechatronics control system electrically connected to each probe card positioning module. The combination of probe card positioning module and chuck movement device achieves a precise positioning of the probe cards probing on multiple positions of a wafer surface and supports a parallel testing function for higher productivity.

16 Claims, 25 Drawing Sheets

WAFER PROBING APPARATUS WITH PROBE CARD POSITIONING MODULE

FIELD OF THE INVENTION

The invention relates to wafer probing apparatuses and more particularly to a wafer probing apparatus for an automatic test system, the wafer probing apparatus including a wafer chuck and a probe card positioning module for achieving a precise positioning of a plurality of probe cards and supporting a parallel testing of objects on a wafer.

BACKGROUND OF THE INVENTION

It is typical to conduct a parallel testing for increasing test performance in a limited space. A plurality of probe cards are used to probe a plurality of test components on different locations of a surface of a wafer when a parallel testing of the test components is conducted. Referring to FIGS. 24 and 25, a conventional wafer probing apparatus is shown. First rail 2 and second rail 3 are provided on two sides of an opening 5 of a stage 1 respectively, and two spaced third rails 4 are slidably disposed on the first rail 2 and second rail 3. However, the conventional wafer probing apparatus has a number of drawbacks as detailed below.

The rails 2, 3 and 4 are supported by the stage 1 thereunder. A large chuck 6 to be heated is disposed within the stage 1. A temperature control device 7 is disposed in the chuck 6 and unfortunately it does not operate reliably. Specifically, the temperature control device 7 may not keep a constant temperature all the time. Further, a plurality of probing stages 8 (or the third rails 4) may change their positions relative to the chuck 6 (or the stage 1) during the wafer test. All of the above factors make a thermal equilibrium among the probing stages 8 to be difficult, thereby compromising a precise positioning of test components.

An operator must visually observe a plurality of probe cards 9 attached to the probing stages 8 and align the probe cards 9 with a test device A respectively in an initial step of the test process. As a result, a temporary alignment of the probe cards 9 with the test device A is obtained. However, a positioning of each probe card 9 is not monitored or recorded in subsequent steps of the test process. Thus, whether a relative position of each probe card 9 with respect to the test device A has changed or not is not confirmed. It is often that the abnormalities are found due to incorrect data only after the test is finished. However, it is too late to find reasons of the abnormalities at this time.

The opening 5 above the chuck 6 is obstructed by the third rails 4 and the probing stages 8 thereabove. It is impossible to access a wafer on the chuck 6 through the opening 5. It is only possible to access the wafer from sides of the chuck 6. This limits design of the conventional wafer probing apparatus and in turn, it makes cost down more difficult and causes inconvenience to maintenance of the chuck 6.

Thus, the need for improvement still exists.

SUMMARY OF THE INVENTION

It is therefore one object of the invention to provide a wafer probing apparatus comprising a wafer probe station including a wafer chuck and a chuck movement device disposed under the wafer chuck and configured to move the wafer chuck wherein a wafer is configured to adhere to the wafer chuck; a lifting mechanism disposed close to the wafer probe station; a support frame provided with the lifting mechanism; at least one probe card positioning module disposed on the support frame, each of the at least one probe card positioning module including at least one needle alignment device, each of the at least one needle alignment device having at least one probe card with at least one probe needle; and a mechatronics control system electrically connected to the at least one probe card positioning module.

The invention has the following advantages and benefits in comparison with the conventional art:

Good stability and availability: it completely abandons the conventional third rails that are adapted to slide on two sides of the stage. It is not limited by the minimum required length of each third rail spanning the stage so that it can be flexibly used for split, independently disposed the needle alignment devices or use a short rail design. If the probe card positioning module is powered by an electric device, the weight it bears can be decreased and this improves performance, increases reliability, and prolongs a useful life of the wafer probing apparatus. The chuck movement device serves as main part because it is used to move the wafer relative to the probe card. Thus, the workload of the probe card positioning module is greatly decreased, thereby effectively decreasing its wear.

Solving the thermal equilibrium problem between the high-temperature heat source and the mechanism: the support frame of the lifting mechanism is used as the foundation of the probe card positioning module and the foundation is sufficiently above the high-temperature heat source of the wafer chuck. Thus, the adverse effect of the high-temperature heat source is decreased and in turn, it relieves the thermal equilibrium problem between the high-temperature heat source and the mechanism. Otherwise, the problem of probe positioning drift may be worse.

Easy access to wafer: a simple operation of the lifting mechanism can quickly and easily remove the obstruction above the wafer chuck (e.g., the probe card positioning module and the support frame). This allows for a more flexible and diverse way of picking up or placing the wafer. Specifically, the wafer can be picked up or placed from above or sides of the wafer chuck. And in turn, it allows more freedom in the hardware design of the wafer probing apparatus to adapt to more diverse applications or support greater simplification of the mechanism, thereby decreasing cost of the apparatus.

Easy maintenance and parts replacement: because the obstruction above the wafer chuck can be quickly, conveniently and temporarily removed, maintenance of the wafer chuck is made easy, and each probe card positioning module can achieve good mechanism independence. Further, the probe card positioning modules can be disposed independently and thus they can be easily maintained or replaced. There is no complicated linkage and superposition of the mechanisms between them and thus there is no need to go through complicated disassembly and assembly operations for parts replacement.

Improvement of mechanism interference: each needle alignment device can be provided with an auxiliary fastener. With the provision of the auxiliary fastener, the restrictions caused by the interference between the needle alignment devices are lessened so that the relative distance between the probe cards can be decreased in order to meet more application requirements.

Stable and reliable wafer probing capability: it facilitates the collection of data of optical imaging or thermal imaging by setting at least one image capture device on each probe card positioning module or an auxiliary rail. Further, the data can be used to quickly precisely align the probe card with the wafer in an initial alignment step of the test process.

Furthermore, the data can be used to detect and record or actively correct the positioning deviation of each probe card for solving the problem of probe positioning drift in subsequent steps of the test process.

The above and other objects, features and advantages of the invention will become apparent from the following detailed description taken with the accompanying drawings.

DETAILED DESCRIPTION OF THE INVENTION

Figure 1:
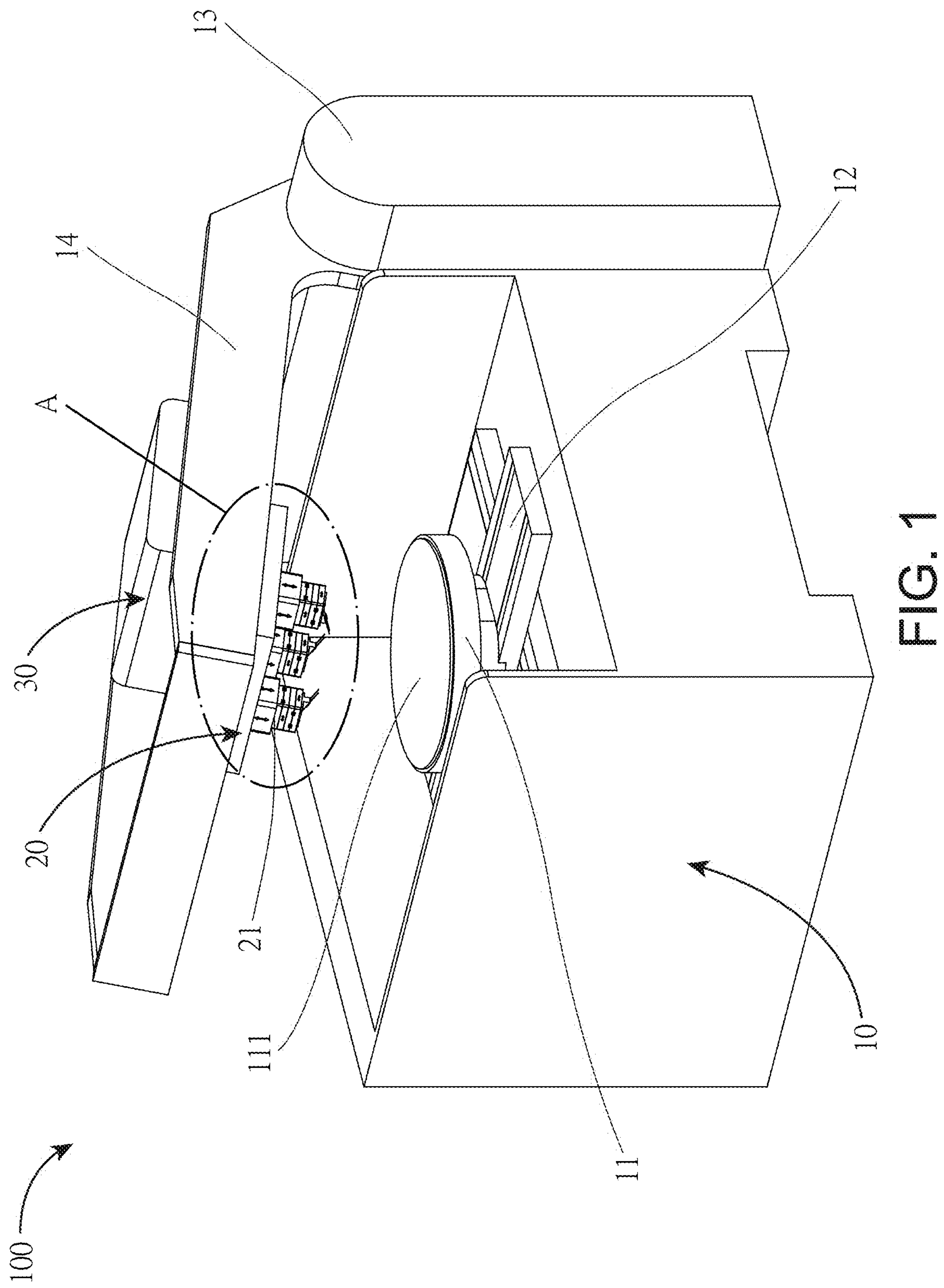
FIG. 1 is a perspective view of a wafer probing apparatus according to a first preferred embodiment of the invention.
Figure 2:
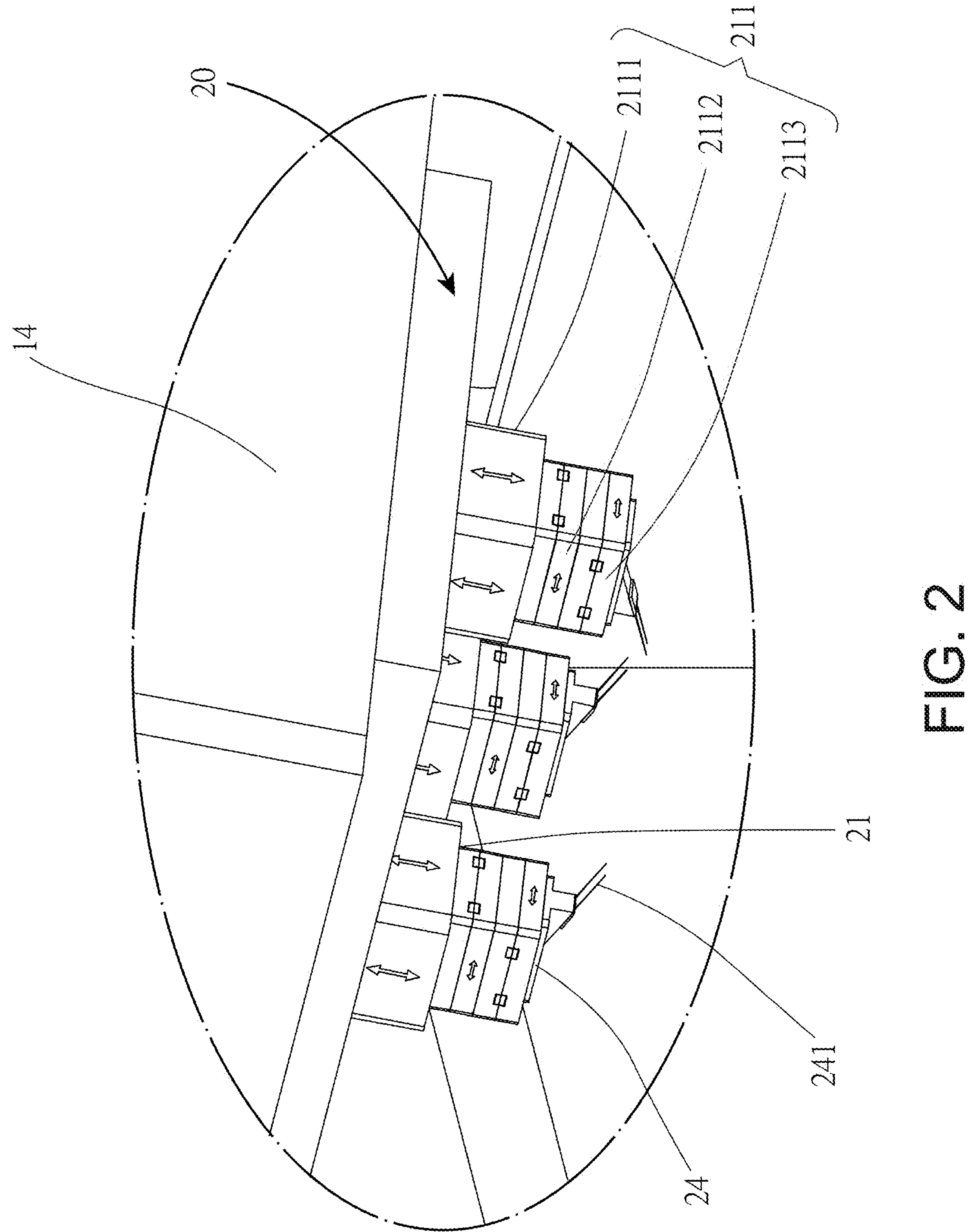
FIG. 2 is a detailed view of the area in oval A of FIG. 1.
Figure 3:
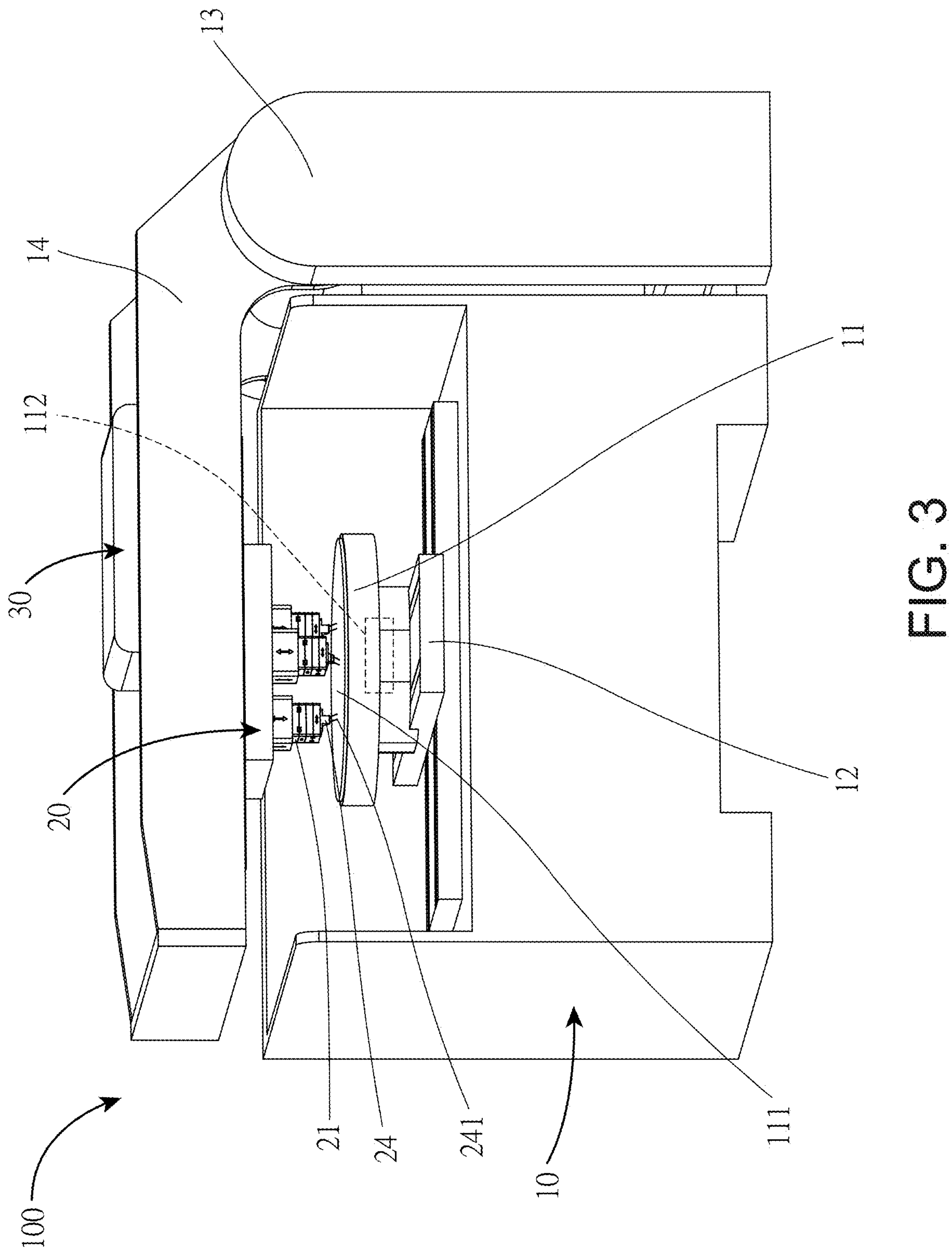
FIG. 3 is another perspective view of FIG. 1 with the lifting mechanism being lowered.

Referring to FIGS. 1 to 3, a wafer probing apparatus 100 in accordance with a first preferred embodiment of the invention comprises the following components as discussed in detail below.

A wafer probe station 10 includes a wafer chuck 11 and a chuck movement device 12 disposed under the wafer chuck 11 and configured to move the wafer chuck 11 in a three-dimensional space. A wafer 111 is adhered to a top surface of the wafer chuck 11 by vacuum. A heating device 112 is provided in the wafer chuck 11 for heating the wafer 111 to a predetermined high temperature (e.g., 200° C.). A lifting mechanism 13 is provided at one side of the wafer probe station 10. In the embodiment, the lifting mechanism 13 is a rotary and has a split design so that the lifting mechanism 13 and the wafer probe station 10 can be separated. This has the advantages of balancing weight of the apparatus 100 and facilitating movement of the apparatus 100. In an alternative embodiment, the lifting mechanism 13 and the wafer probe station 10 are unitary (i.e., joined). In another alternative embodiment, the lifting mechanism 13 is implemented as a lift or any of other equivalent designs. In the embodiment, a support frame 14 is pivotably provided on a top of the lifting mechanism 13. In an alternative embodiment, the support frame 14 is implemented as any of other equivalent designs and is not limited to the one as shown.

A probe card positioning module 20 is disposed on an underside of the support frame 14. The probe card positioning module 20 and the support frame 14 can be fastened together in one of a plurality of different designs not limited to the one as shown. The probe card positioning module 20 includes a plurality of independent needle alignment devices 21, thereby greatly decreasing interference among them and facilitating the needle alignment devices 21 to sequentially adjust the initial alignment with the wafer 111. The needle alignment device 21 includes an electric fine-tuning device 211 having a Z-axis actuator 2111, a Y-axis actuator 2112, and an X-axis actuator 2113 so that the electric fine-tuning device 211 may have a fine-tuning function along each of X, Y, and Z axes. The electric fine-tuning device 211 can be implemented as a piezo stage, a piezo actuator, a piezo motor, a step motor, a servo motor, a voice coil motor, a Stewart platform or any of other electric actuators having a fine-tuning function. In another alternative embodiment, the electric fine-tuning device 211 further comprises a rotary or tilt actuator for providing a further fine-tuning function. A probe card 24 is provided on an underside of each electric fine-tuning device 21. The probe card 24 includes at least one probe needle 241.

A mechatronics control system 30 is electrically connected to the probe card positioning module 20 and each needle alignment device 21 respectively so that the mechatronics control system 30 can control each needle alignment device 21 which in turn may move the probe card 24. In an alternative embodiment, the mechatronics control system 30 can further control each needle alignment device 21 which in turn may rotate or tilt the probe card 24. The mechatronics control system 30 is provided on a top of the support frame 14. But the mechatronics control system 30 may be provided in any of other desired locations not limited to the one as shown.

Prior to testing a wafer, it is required to confirm whether each needle alignment device 21 is correctly provided with the probe card 24. Next, the mechatronics control system 30 is activated to adjust each needle alignment device 21 to a desired position. At this time, the lifting mechanism 13 is activated to pivot the support frame 14 which in turn lowers the probe card positioning module 20 until each probe needle 241 is in close proximity to a surface of the wafer 111. Next, both the mechatronics control system 30 and the chuck movement device 12 activate to fine-tune each needle alignment device 21 and the wafer chuck 11 respectively until the probe needle 241 of each probe card 24 contacts a desired position on the surface of the wafer 111. A precise alignment of each probe card 24 with the wafer 111 is finished. Since the probe card positioning module 20 includes the independent needle alignment devices 21, interference from the needle alignment devices 21 is greatly decreased in the fine-tuning step. Otherwise, multiple times of fine-tuning of each needle alignment device 21 are required.

A wafer test is conducted after the alignment step is finished. Particularly, the chuck movement device 12 moves the wafer chuck 11 in a three-dimensional space for a precise three-axis movement in the test. Thus, the wafer 111 can be moved relative to each probe card 24 for a precise movement and each probe needle 241 may correctly contact different positions on the surface of the wafer 111. Therefore, a test apparatus (not shown) may conduct a parallel testing of circuit elements at different positions on the surface of the wafer 111.

Figure 4:
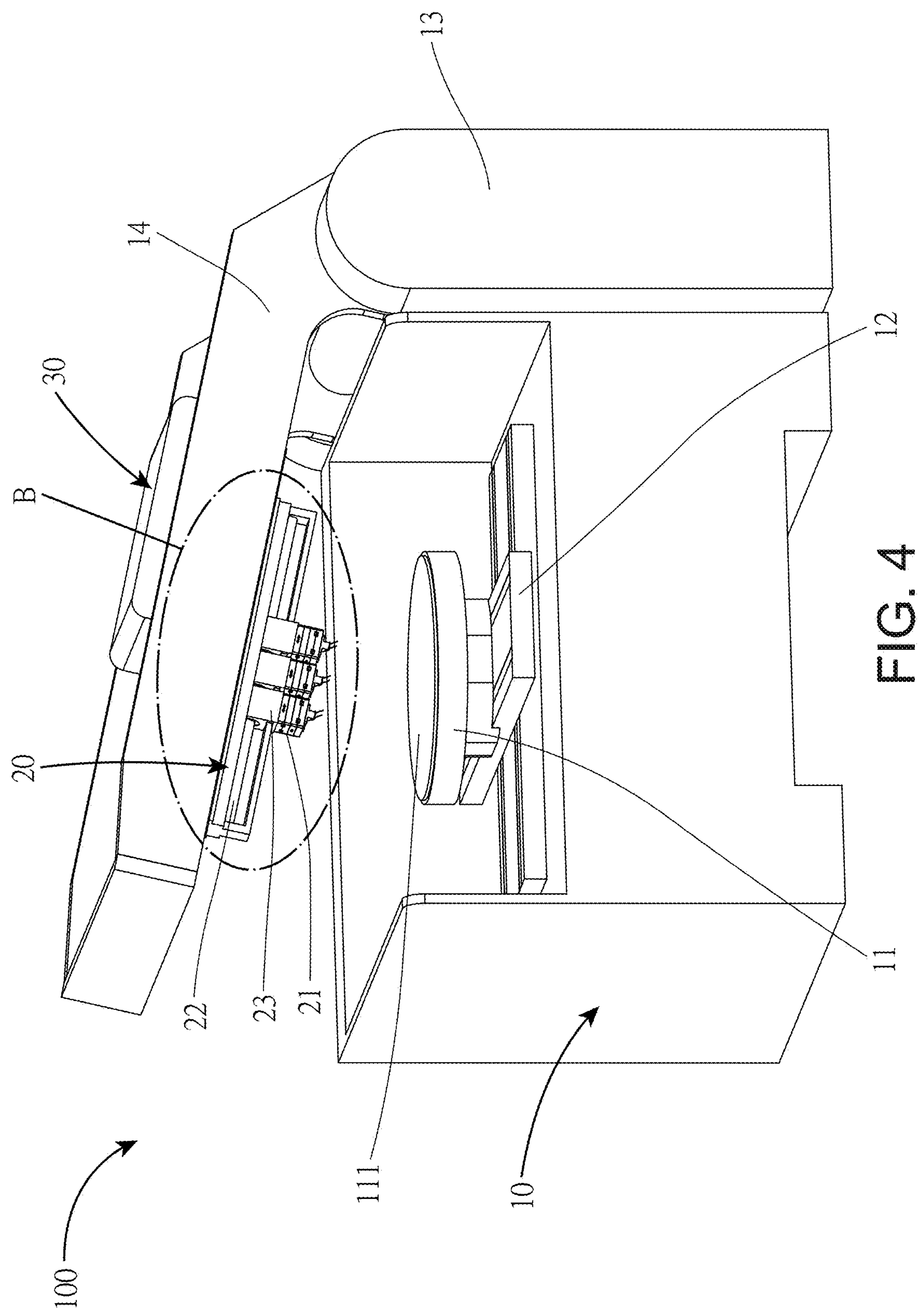
FIG. 4 is a perspective view of a wafer probing apparatus according to a second preferred embodiment of the invention.
Figure 5:
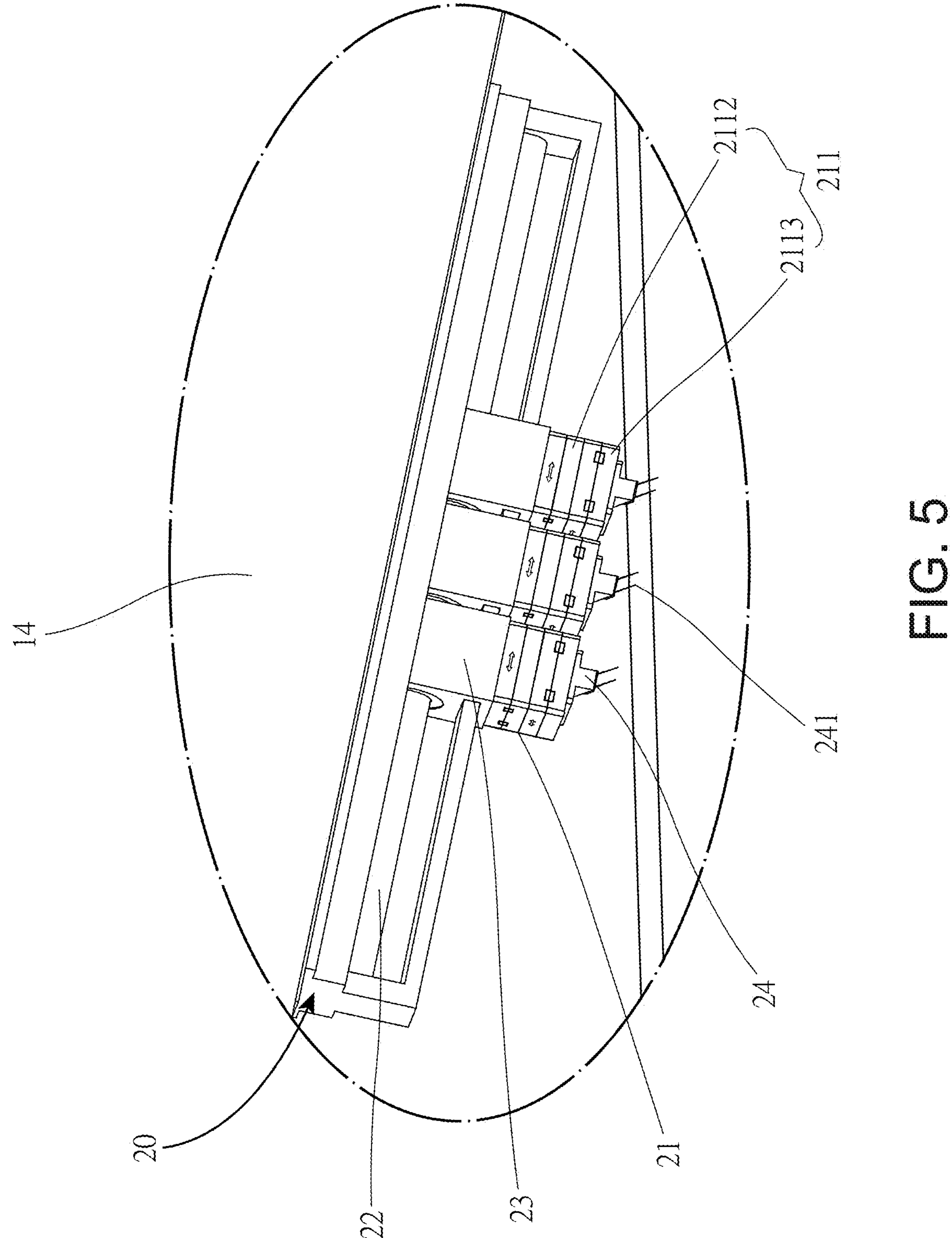
FIG. 5 is a detailed view of the area in oval B of FIG. 4.

Referring to FIGS. 4 to 5, a wafer probing apparatus 100 in accordance with a second preferred embodiment of the invention is shown. The characteristics of the second preferred embodiment are substantially the same as that of the first preferred embodiment except the following: the probe card positioning module 20 further comprises a probing rail 22 and a plurality of probing slides 23 slidably disposed on the probing rail 22. The needle alignment device 21 is attached to each probing slide 23. In the embodiment, each electric fine-tuning device 211 only includes a Y-axis actuator 2112 and an X-axis actuator 2113 and thus a fine-tuning function along Z-axis is not provided for saving cost. The mechatronics control system 30 is electrically connected to the probing slides 23 and the needle alignment devices 21 so that the mechatronics control system 30 can control each probing slide 23 which in turn may move along the probing rail 22. Further, the mechatronics control system 30 can precisely move each needle alignment device 21 along X-axis and Y-axis. By utilizing the probing rail 22, it is possible to provide a greater movement range and combine with a precise movement of each needle alignment device 21. Therefore, the invention has a great flexibility in applications.

Figure 6:
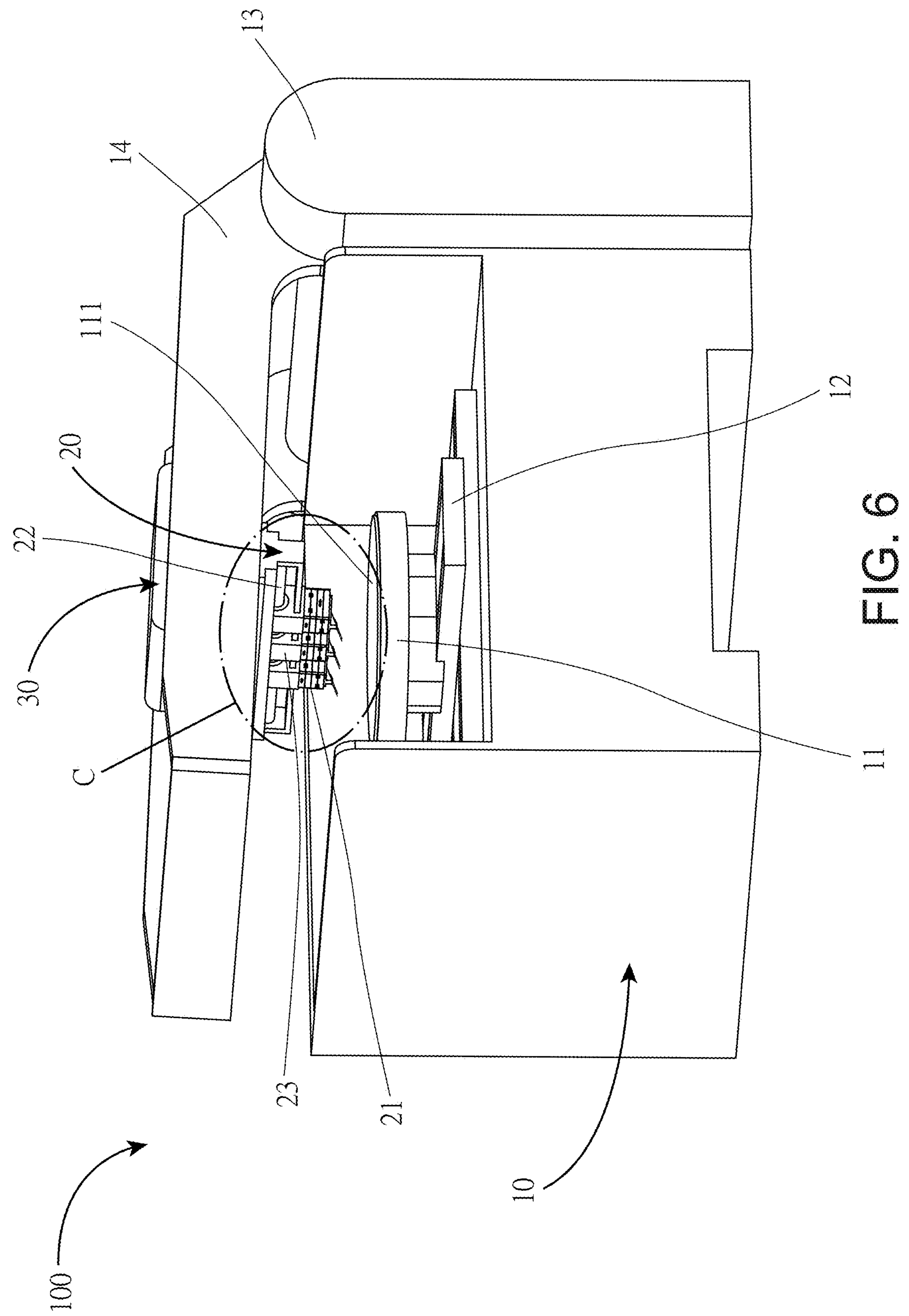
FIG. 6 is a perspective view of a wafer probing apparatus according to a third preferred embodiment of the invention.
Figure 7:
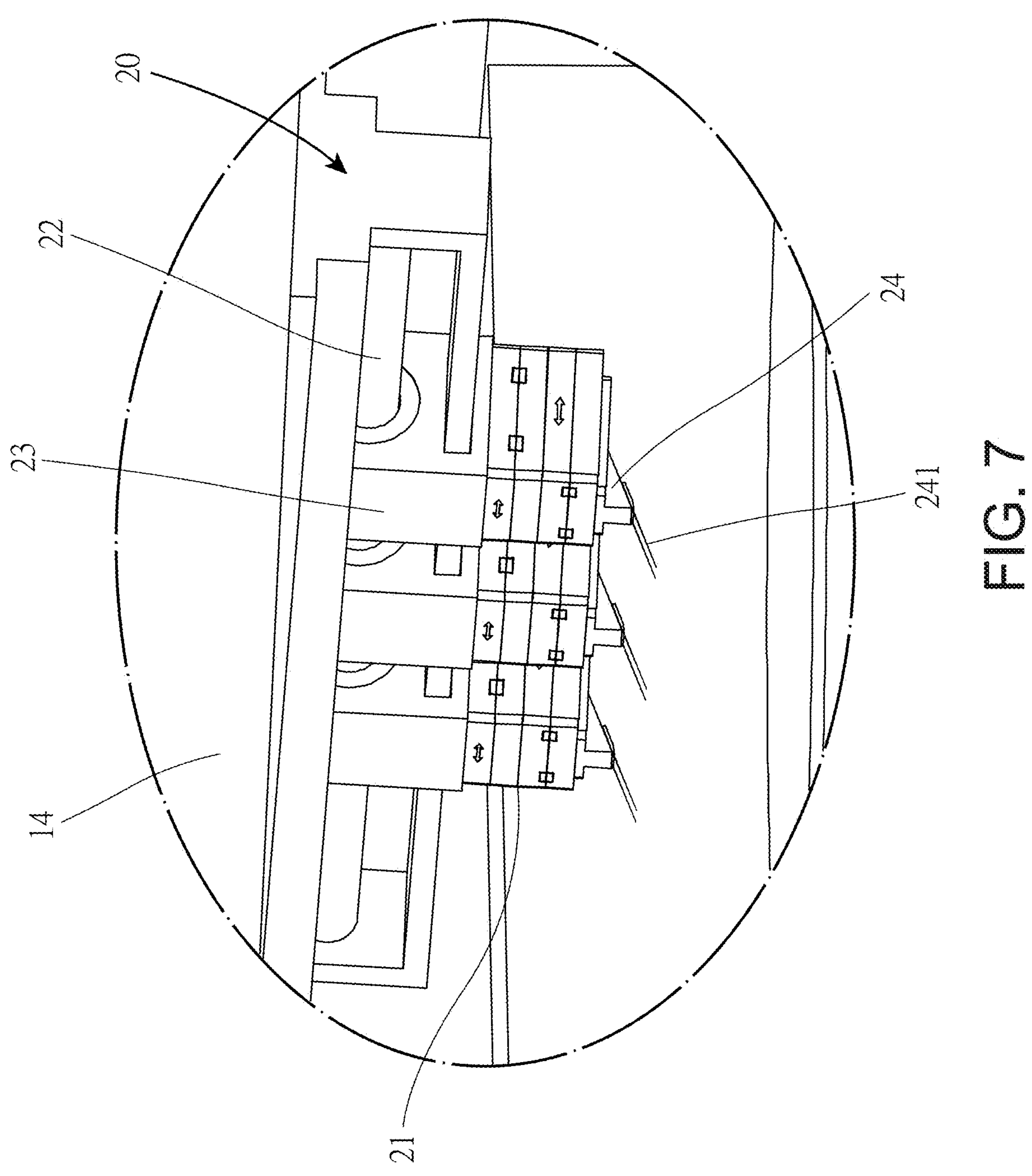
FIG. 7 is a detailed view of the area in oval C of FIG. 6.

Referring to FIGS. 6 to 7, a wafer probing apparatus 100 in accordance with a third preferred embodiment of the invention is shown. The characteristics of the third preferred embodiment are substantially the same as that of the second preferred embodiment except the following: the probe card positioning module 20 rotates 90 degrees about the support frame 14 prior to disposing on the support frame 14. The probe card positioning module 20 has an improved modular design and complexity of the conventional intersected, superimposed rails is eliminated. Therefore, the invention is easily adapted to designs of different orientations.

Figure 8:
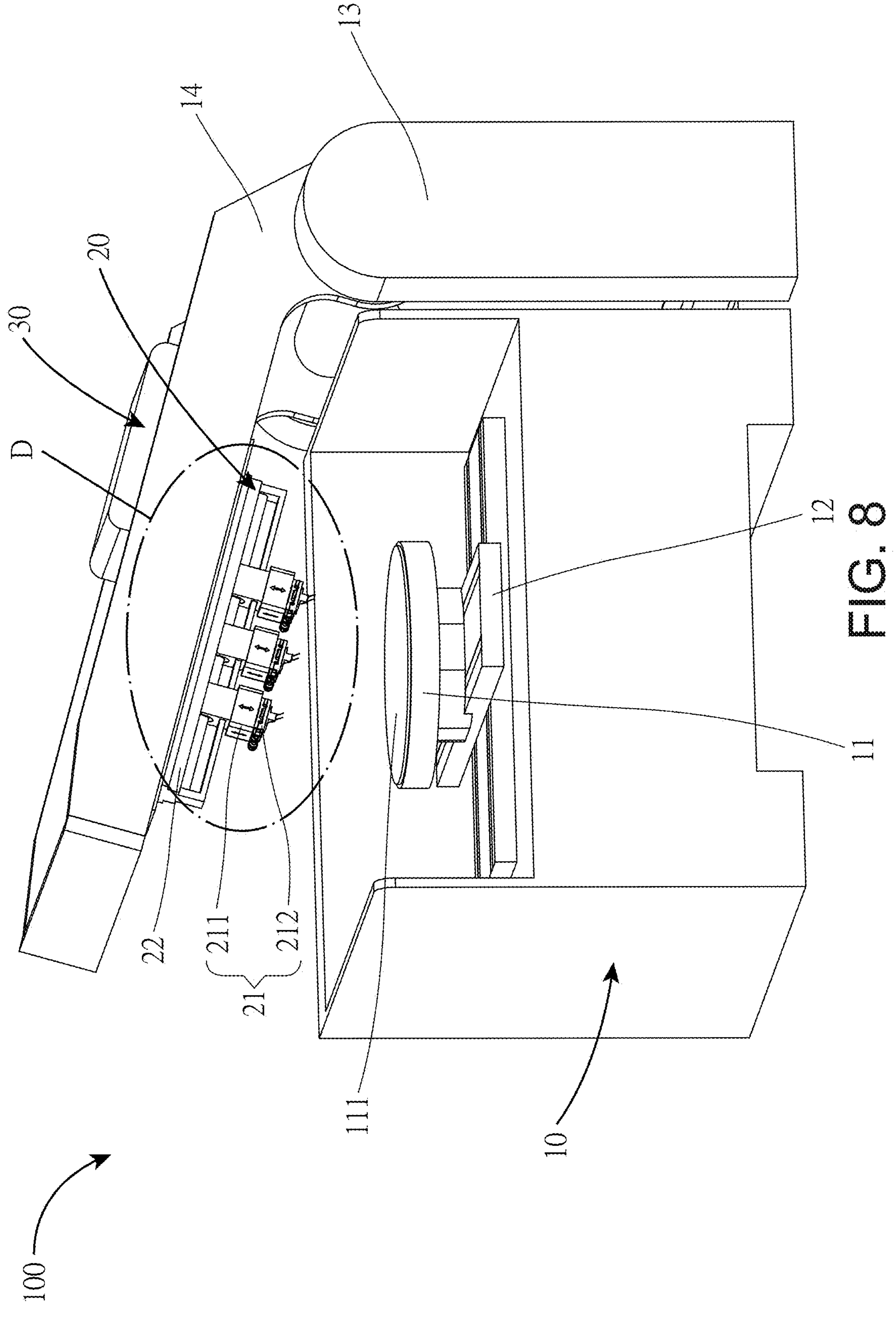
FIG. 8 is a perspective view of a wafer probing apparatus according to a fourth preferred embodiment of the invention.
Figure 9:
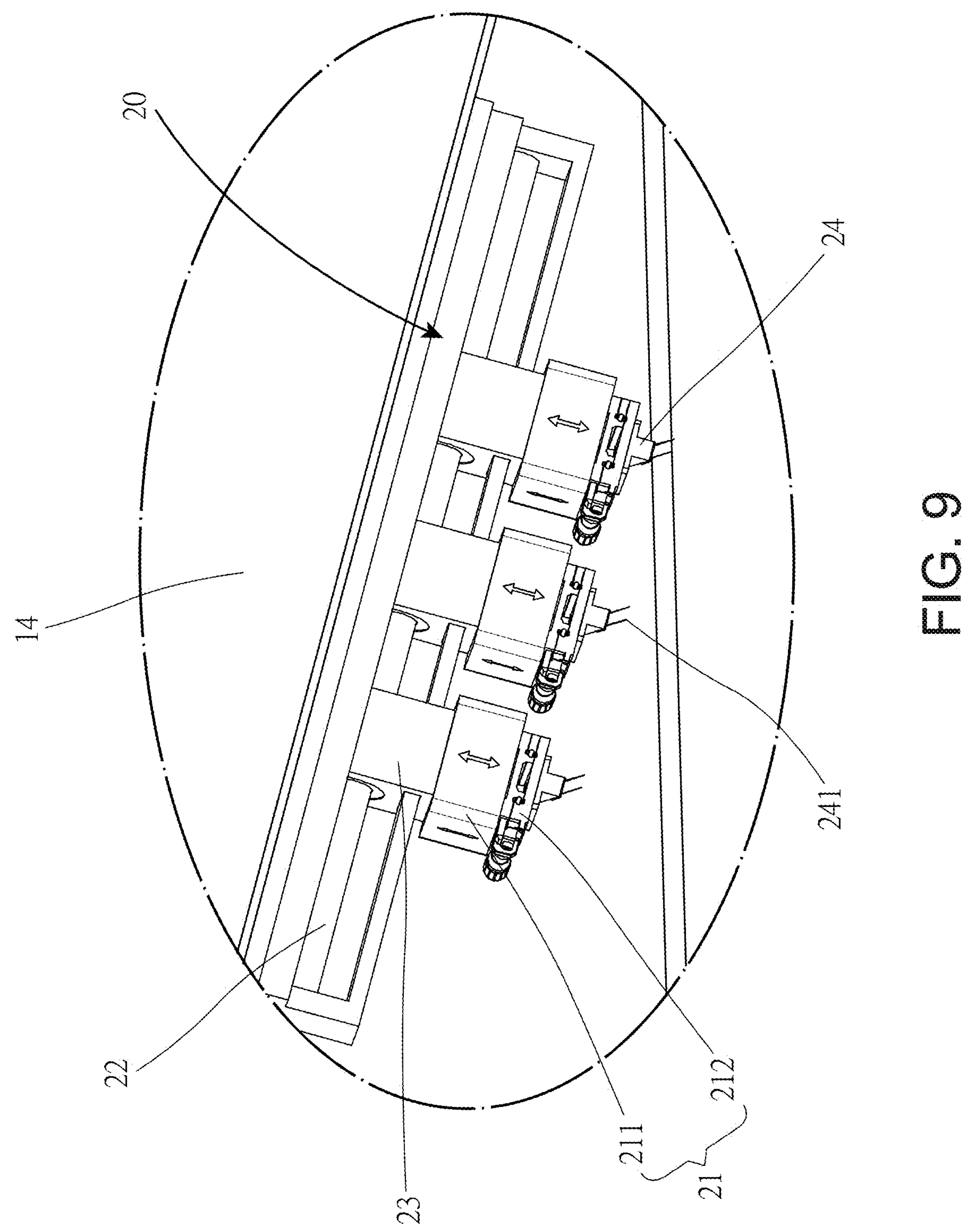
FIG. 9 is a detailed view of the area in oval D of FIG. 8.

Referring to FIGS. 8 to 9, a wafer probing apparatus 100 in accordance with a fourth preferred embodiment of the invention is shown. The characteristics of the fourth preferred embodiment are substantially the same as that of the second preferred embodiment except the following: each needle alignment device 21 includes an electric fine-tuning device 211 and a manual fine-tuning device 212 disposed under the electric fine-tuning device 211. Each probe card 24 is disposed on an underside of the manual fine-tuning device 212. Each electric fine-tuning device 211 and each manual fine-tuning device 212 are simplified to provide a precise fine-tuning adjustment along a single direction. Alternatively, a manual fine-tuning function of each needle alignment device 21 can be expanded or changed. For example, the manual fine-tuning device 212 may have the function of moving, rotating, or tilting. Each probe card 24 can move, rotate, or tilt by operating each manual fine-tuning device 212. Thus, the electric mechanism can be greatly simplified and the cost can be reduced. Otherwise, system complexity or malfunction probability may be greatly increased due to an unnecessary electric mechanism. The electric fine-tuning device 211 of the fourth embodiment and the probe card 24 are not joined directly. To the contrary, the probe card 24 is provided on the underside of the electric fine-tuning device 211 in the first embodiment so that the probe card 24 and the electric fine-tuning device 211 may be joined directly or indirectly. In the fourth embodiment, the manual fine-tuning device 212 and the probe card 24 are joined directly. In an alternative design of the needle alignment device 21 in consideration of different applications, a joining sequence of the electric fine-tuning device 211 and the manual fine-tuning device 212 is changed in which the probe card 24 and the manual fine-tuning device 212 are joined directly or indirectly.

Figure 10:
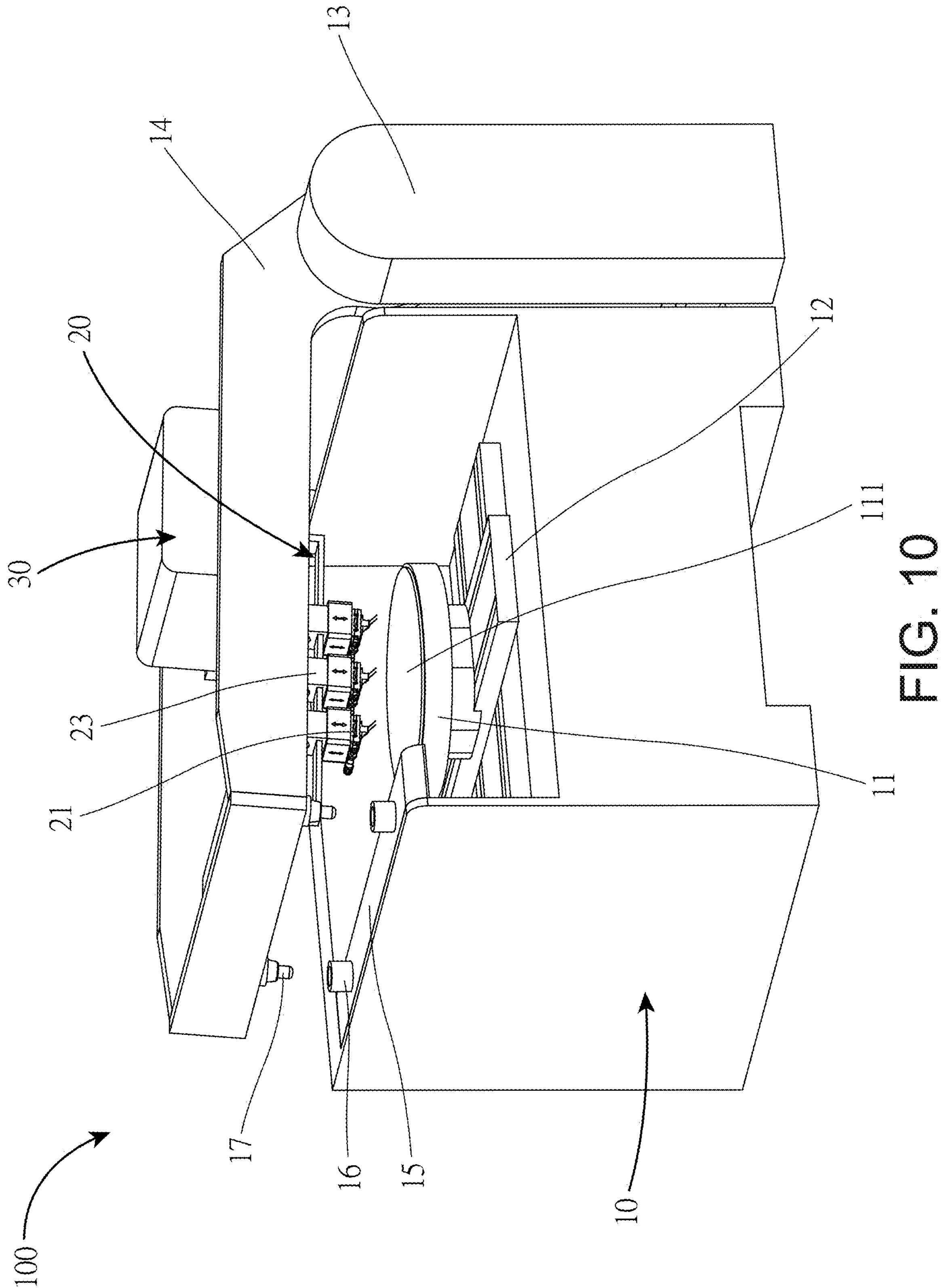
FIG. 10 is a perspective view of a wafer probing apparatus according to a fifth preferred embodiment of the invention.
Figure 11:
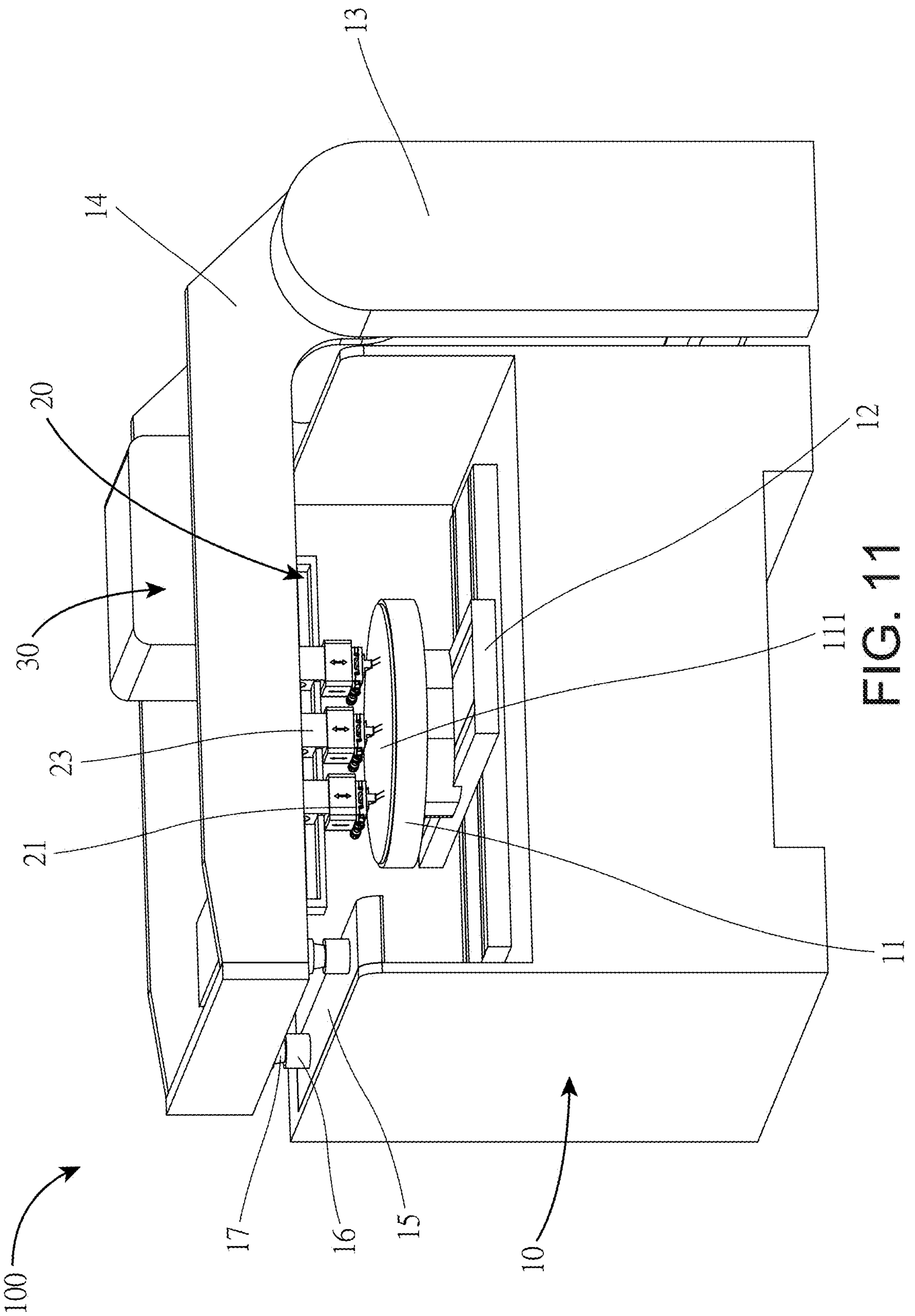
FIG. 11 is another perspective view of FIG. 10 with the lifting mechanism being lowered.

Referring to FIGS. 10 to 11, a wafer probing apparatus 100 in accordance with a fifth preferred embodiment of the invention is shown. The characteristics of the fifth preferred embodiment are substantially the same as that of the first or fourth preferred embodiment except the following: an auxiliary stage 15 is provided on a top of the wafer probe station 10. Two spaced positioning sleeves 16 are provided on a top of the auxiliary stage 15. Two spaced positioning posts 17 are provided on an underside of the support frame 14 and are adapted to insert into the positioning sleeves 16 respectively. Thus, the support frame 14 is precisely positioned relative to the wafer probe station 10. Dust is prevented from falling onto the wafer chuck 11 and the wafer 111 is protected from light when the support frame 14 is pivoted down to close the wafer probe station 10. Shapes and locations of the auxiliary stage 15 can be changed in consideration of different applications. In an alternative embodiment, more shielding structures can be provided if darkness is critical for application. Also, the shapes and locations of the positioning sleeves 16 and the positioning posts 17 can be changed in an equivalent design.

Figure 12:
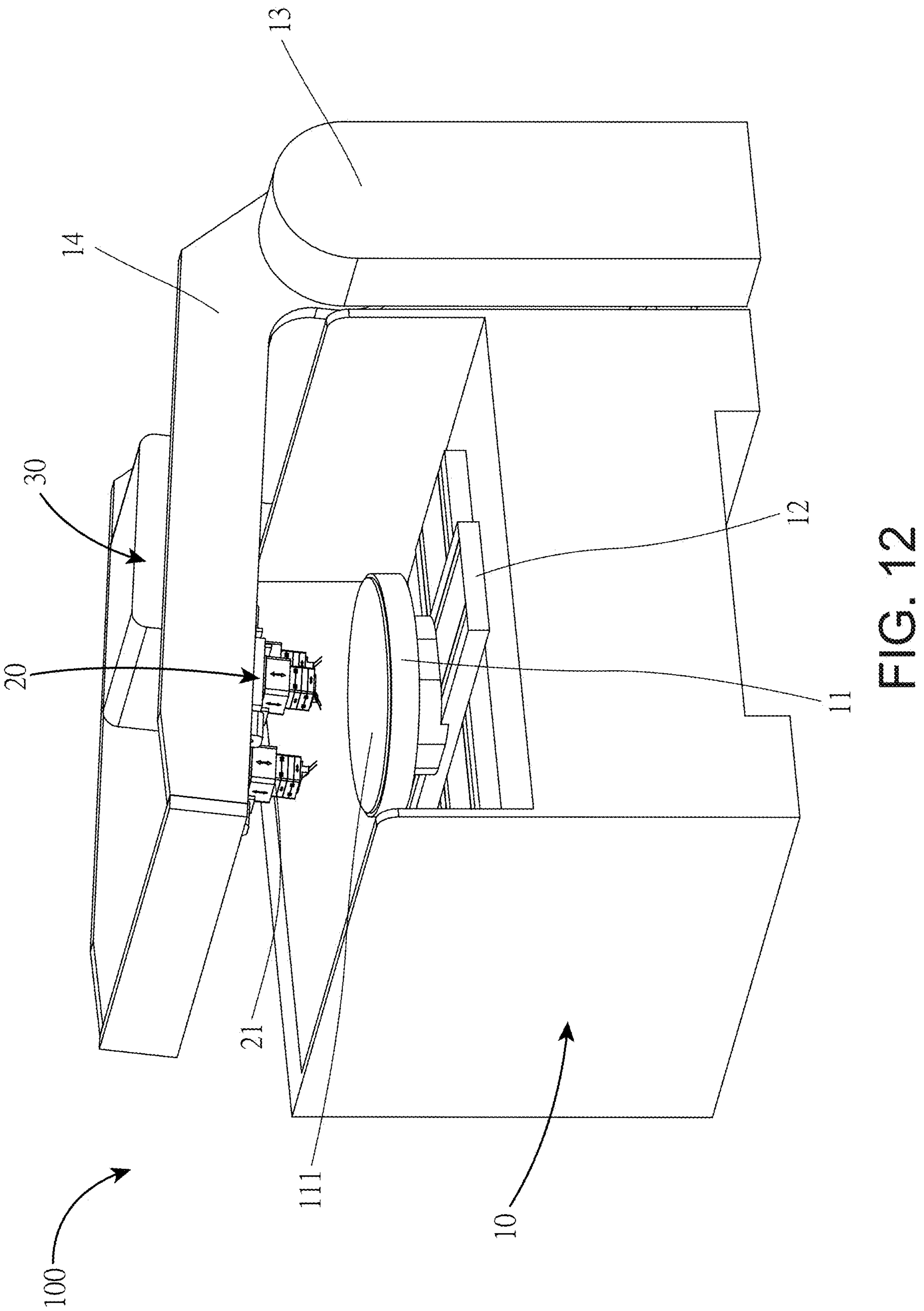
FIG. 12 is a perspective view of a wafer probing apparatus according to a sixth preferred embodiment of the invention.
Figure 13:
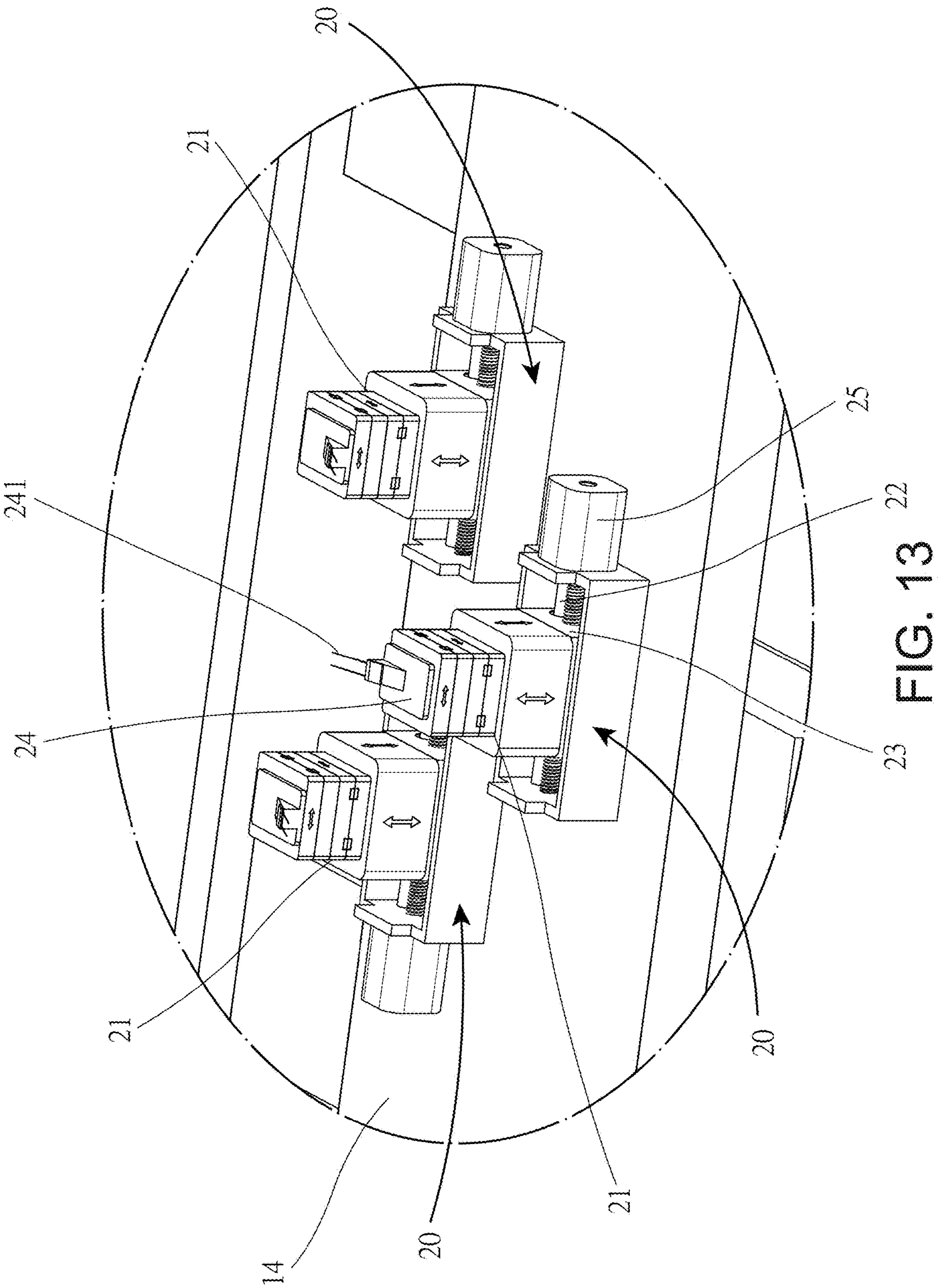
FIG. 13 is a greatly enlarged view of the probe card positioning modules of FIG. 12 after the support frame has been upward pivoted about 180 degrees.

Referring to FIGS. 12 to 13, a wafer probing apparatus 100 in accordance with a sixth preferred embodiment of the invention is shown. The characteristics of the sixth preferred embodiment are substantially the same as that of the second preferred embodiment except the following: a plurality of spaced probe card positioning modules 20 are provided on an underside of the support frame 14. Each probe card positioning module 20 includes a probing rail 22, a probing slide 23 slidably disposed on the probing rail 22, and a drive unit 25 disposed at one side of the probing rail 22 and electrically connected to the mechatronics control system 30. The drive unit 25 is implemented as a step motor or any of other electric drives having the same function. The probing slide 23 is activated by the drive unit 25 to move along the probing rail 22. The needle alignment device 21 is provided on an underside of the probing slide 23. But the needle alignment device 21 may be provided on a different position of the probing slide 23 and this is not limiting. In the embodiment, the probing rails 22 are short rails for saving cost and gaining flexibility. Since the probing slide 23 with the needle alignment device 21 and the probing rail 22 are compactly modularized, and the probe card positioning modules 20 being independent, there is no complicated linkage and superposition of the mechanisms among them and maintenance is made easy. Each needle alignment device 21 can be independently precisely aligned with the wafer 111 for initial adjustment step in the test process. Therefore, interference among them is eliminated.

Figure 14:
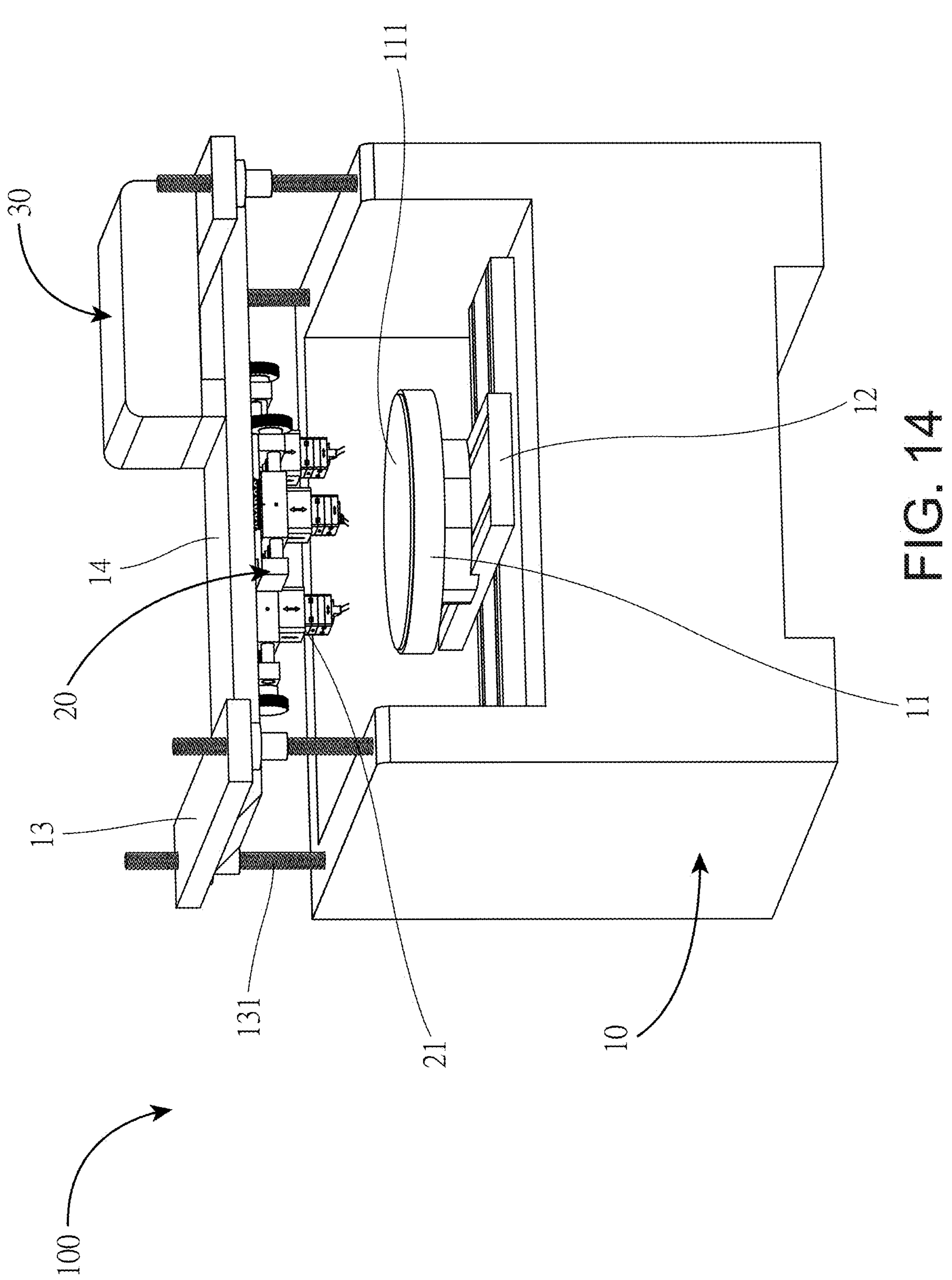
FIG. 14 is a perspective view of a wafer probing apparatus according to a seventh preferred embodiment of the invention.
Figure 15:
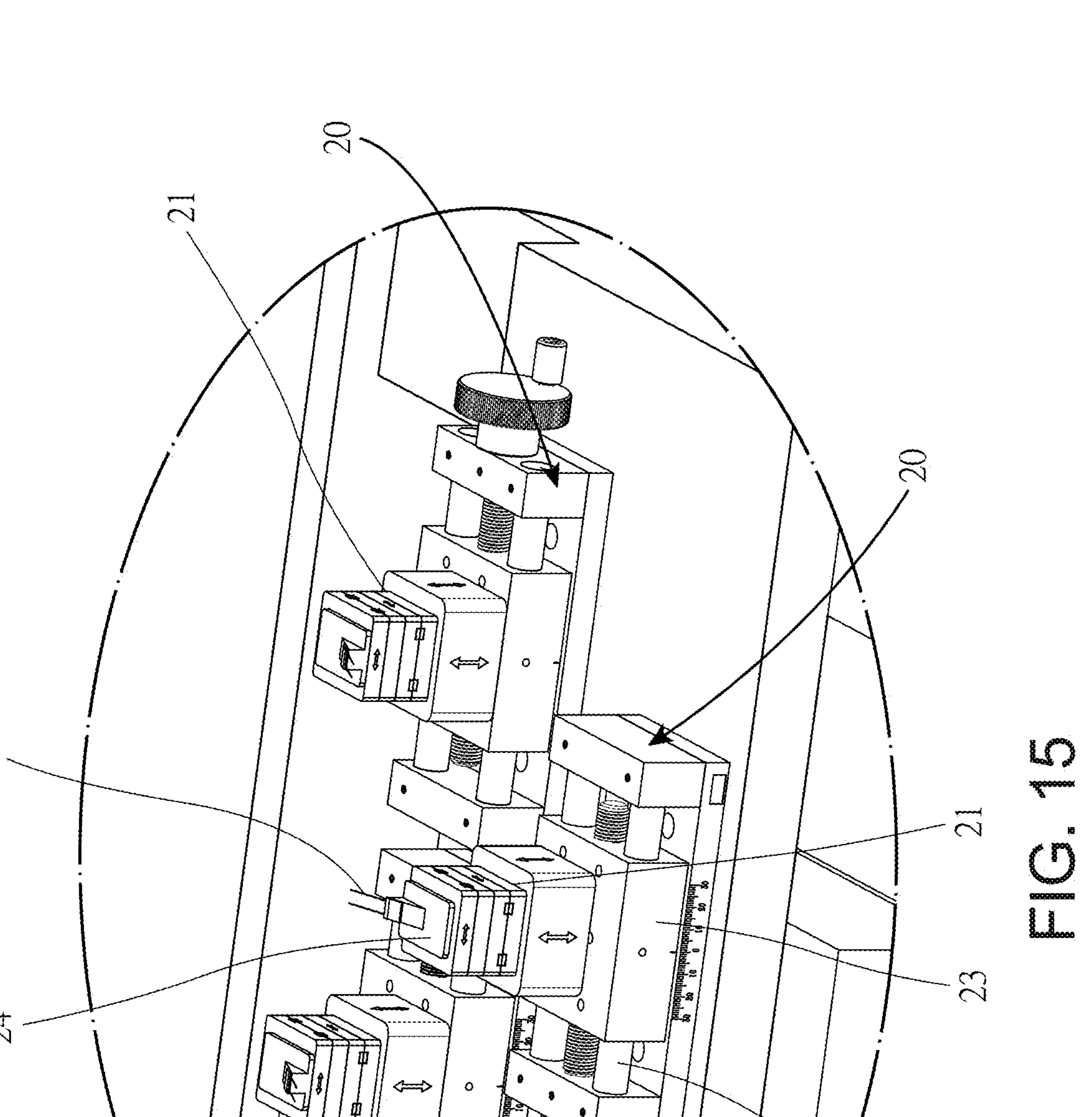
FIG. 15 is a greatly enlarged view of the probe card positioning modules of FIG. 14 after the support frame has been detached and disposed upside down.

Referring to FIGS. 14 to 15 in conjunction with FIG. 13, a wafer probing apparatus 100 in accordance with a seventh preferred embodiment of the invention is shown. The characteristics of the seventh preferred embodiment are substantially the same as that of the sixth preferred embodiment except the following: the upward and downward moveable lifting mechanisms 13 are unitary for saving space. The lifting mechanisms 13 are moveably secured to the wafer probe station 10 by threadedly mounting on four screw devices 131. Thus, the support frame 14 may move upward or downward. Otherwise, the lifting mechanisms 13 may occupy a large space if they are implemented as a split or rotary design. A manual device 26 may be provided at one side of each probing rail 22 and connected thereto as a replacement of the drive unit 25 in the sixth embodiment if cost down and a seldom movement of the probing slides 23 are considered to have top priority. An individual may operate the manual device 26 to move the probing slide 23 on the probing rail 22. A precise movement of the wafer chuck 11 provides the function of required relative movement in a wafer test process for many applications. The probing slides 23 are usually motionless after an initial adjustment is made.

Figure 16:
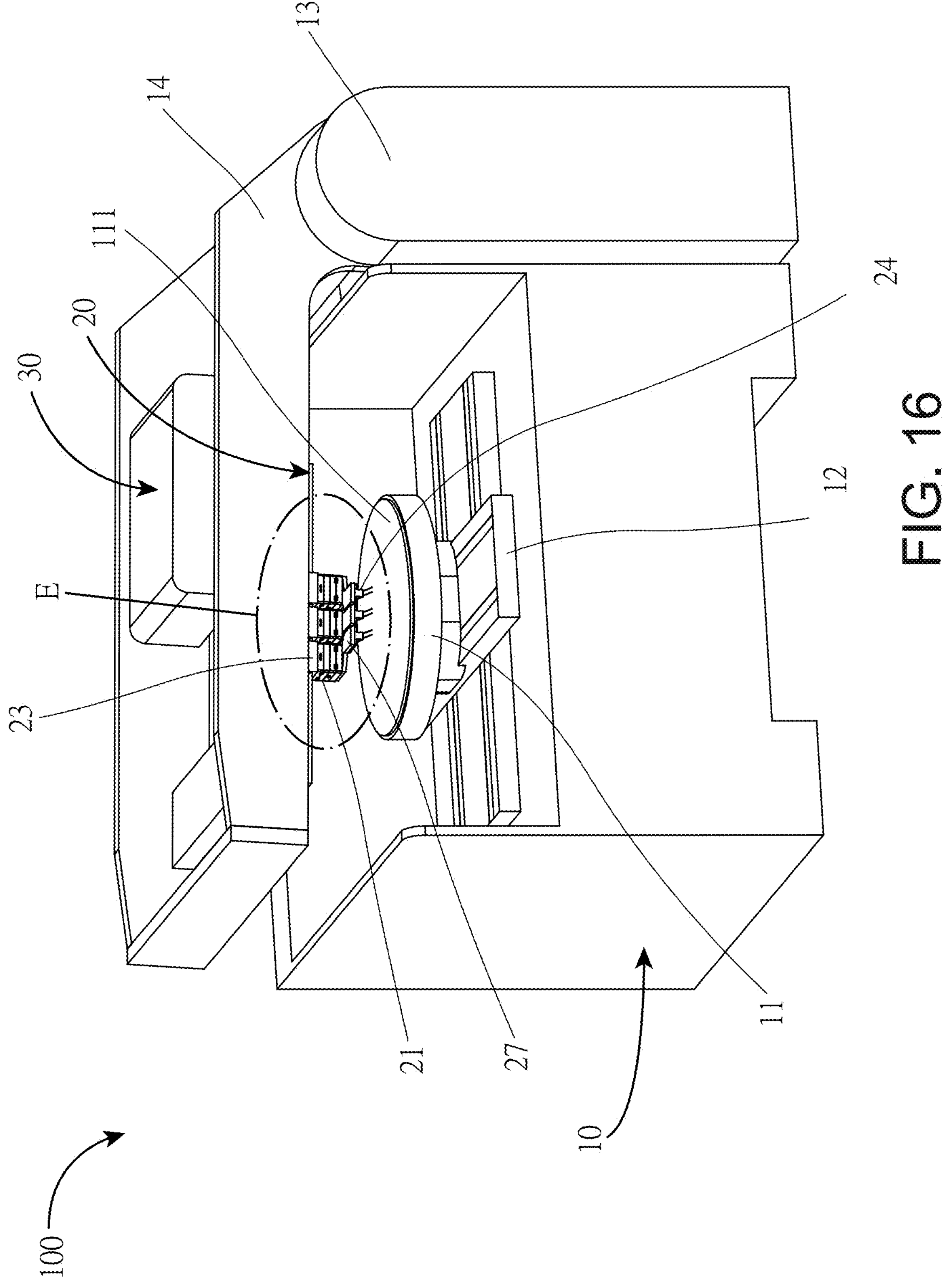
FIG. 16 is a perspective view of a wafer probing apparatus according to an eighth preferred embodiment of the invention.
Figure 17:
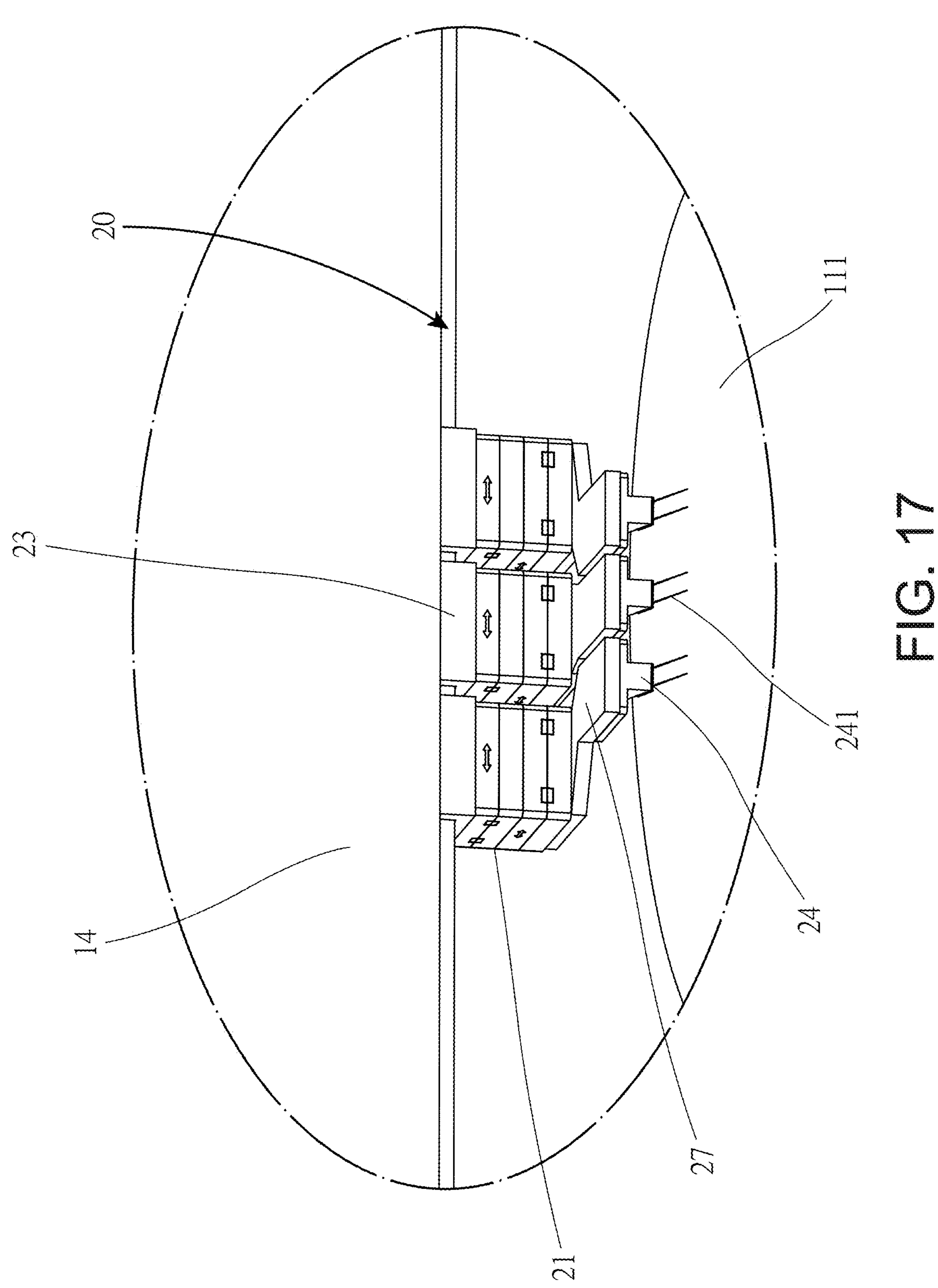
FIG. 17 is a detailed view of the area in oval E of FIG. 16.

Referring to FIGS. 16 to 17, a wafer probing apparatus 100 in accordance with an eighth preferred embodiment of the invention is shown. The characteristics of the eighth preferred embodiment are substantially the same as that of the first or second preferred embodiment except the following: A plurality of auxiliary fasteners 27 are provided at lower portions of one sides of the needle alignment devices 21 respectively. A probe card 24 is provided with each auxiliary fastener 27. Shapes and sizes of the auxiliary fasteners 27 can be changed for meeting requirements (i.e., they being same, partially same, or different). With the provision of the auxiliary fasteners 27, restrictions caused by interference among the needle alignment devices 21 can be lifted so that a distance between any two probe cards 24 can be decreased for meeting more application requirements. Alternatively, design of the auxiliary fasteners 27 can be changed so that the needle alignment devices 21 can be disposed further away from the wafer chuck 11 thereunder. Therefore, adverse effect of the heat source is lessened.

Figure 18:
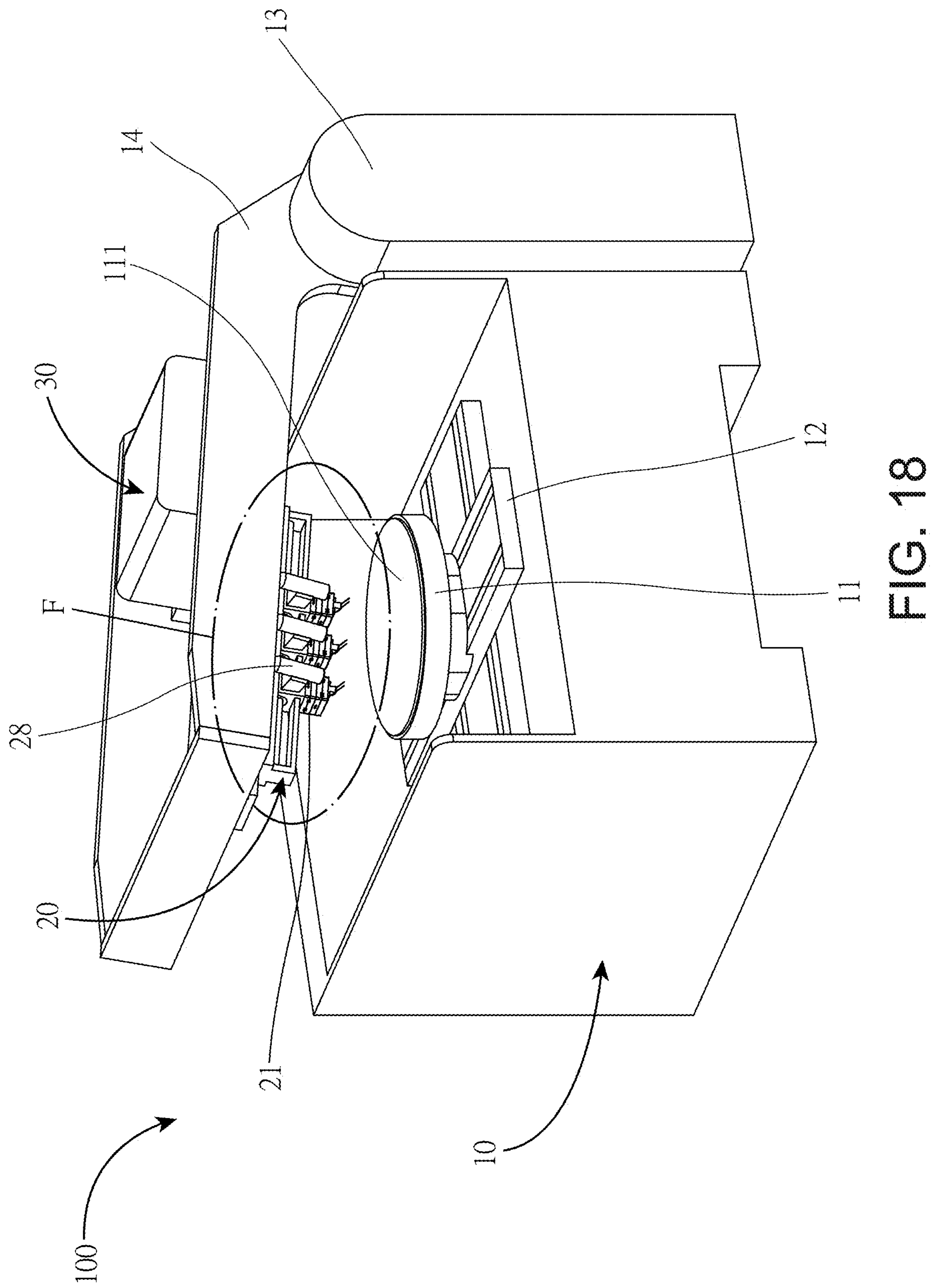
FIG. 18 is a perspective view of a wafer probing apparatus according to a ninth preferred embodiment of the invention.
Figure 19:
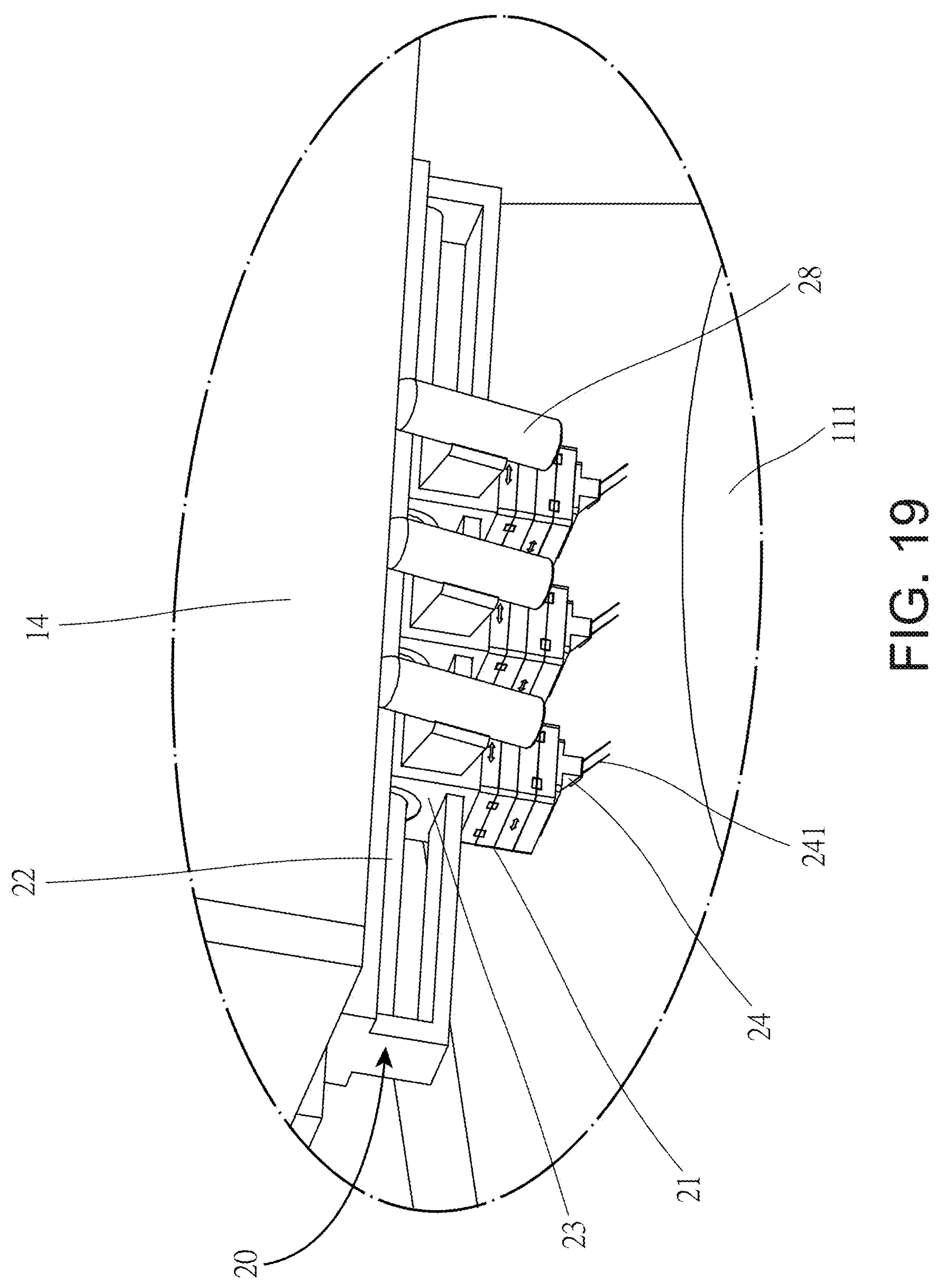
FIG. 19 is a detailed view of the area in oval F of FIG. 18.

Referring to FIGS. 18 to 19, a wafer probing apparatus 100 in accordance with a ninth preferred embodiment of the invention is shown. The characteristics of the ninth preferred embodiment are substantially the same as that of the second preferred embodiment except the following: an image capture device 28 is provided at one side of each probing slide 23. The image capture device 28 is used to collect data of optical images or thermal images of each probe needle 241 and the wafer 111. The data is analyzed to determine whether there is deviation of the positioning of each probe needle 241 and this in turn may solve problems induced by temperature changes. For example, the wafer 111 undergoes a temperature increase in a test. It is understood that usually a material may expand in response to an increase in temperature (i.e., thermal expansion). Thus, a precise alignment of each probe needle 241 with the wafer 111 cannot be maintained for a long period of time. Fortunately, with the provision of the image capture device 28, it is easy to collect data of the optical images or the thermal images. In the initial stage of the wafer test, it facilitates an efficient adjustment of the alignment of each probe needle 241 with the wafer 111. In the subsequent stages of the wafer test process, it may use artificial intelligence of machine vision and image analysis to sense probing deviation. Therefore, it can actively correct a positioning deviation of each probe card 24 and solve the problem of probe positioning drift.

Figure 20:
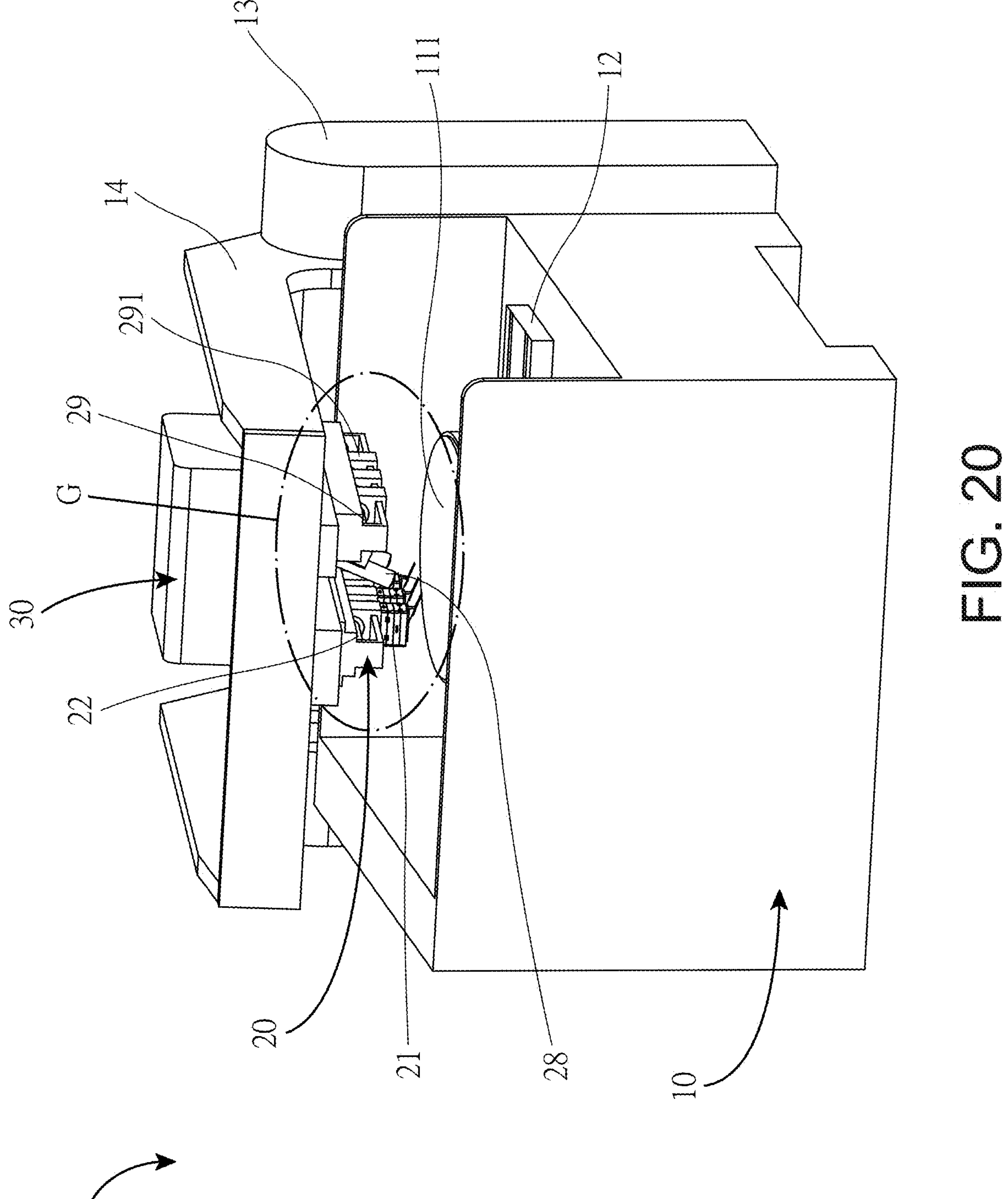
FIG. 20 is a perspective view of a wafer probing apparatus according to a tenth preferred embodiment of the invention.
Figure 21:
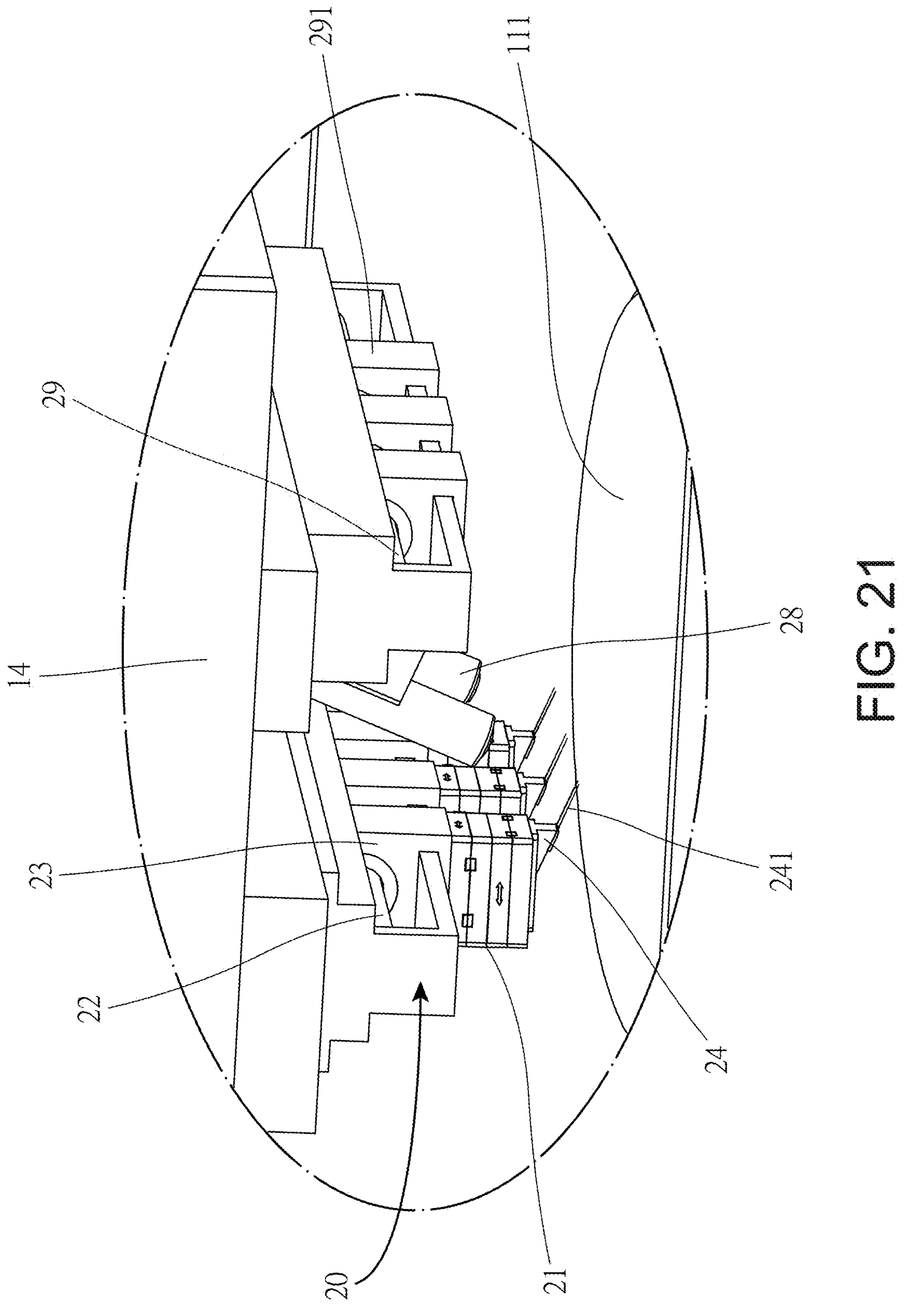
FIG. 21 is a detailed view of the area in oval G of FIG. 20.

Referring to FIGS. 20 to 21, a wafer probing apparatus 100 in accordance with a tenth preferred embodiment of the invention is shown. The characteristics of the tenth preferred embodiment are substantially the same as that of the ninth preferred embodiment except the following: an auxiliary rail 29 is further provided on the support frame 14. The auxiliary rail 29 is spaced from the probing rail 22 by a predetermined distance. The auxiliary rail 29 includes a plurality of imaging positioning slides 291. An image capture device 28 is disposed on each imaging positioning slide 291. The imaging positioning slides 291 are electrically connected to the mechatronics control system 30. The mechatronics control system 30 can activate each imaging positioning slide 291 to move along the auxiliary rail 29. Thus, each image capture device 28 can correctly capture an image of a position of each probe needle 241 contacting the wafer 111. A precise positioning capability of the probe card positioning module 20 is prevented from being compromised because the image capture devices 28 are provided on the auxiliary rail 29 rather than directly mounted with any of the probing slide 23. The image capture devices 28 can capture images individually or as a whole in order to monitor and determine whether there is probe positioning drift during the wafer test in real time. Further, the problem of probe positioning drift can be corrected in real time if it happens.

Figure 22:
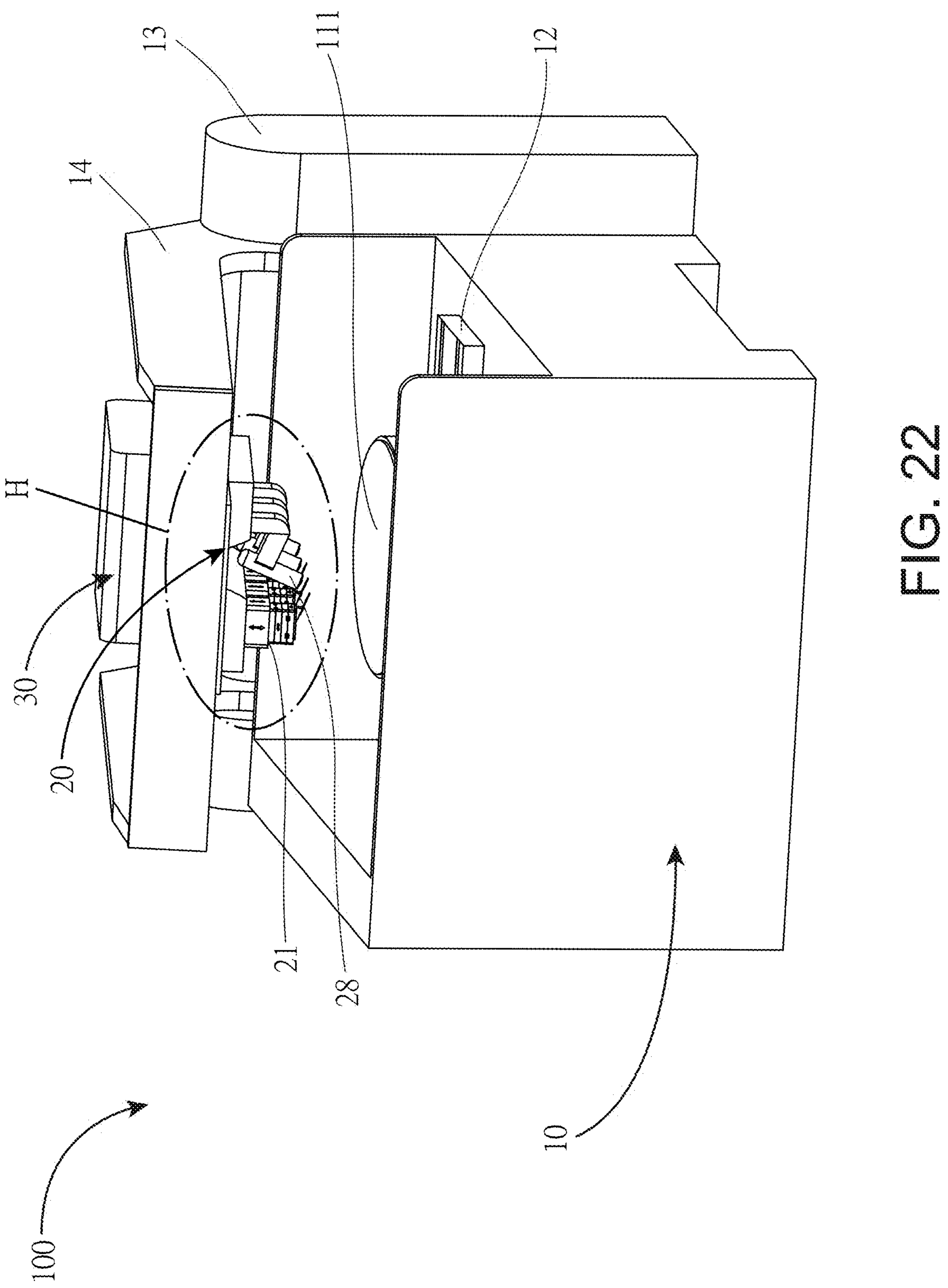
FIG. 22 is a perspective view of a wafer probing apparatus according to an eleventh preferred embodiment of the invention.
Figure 23:
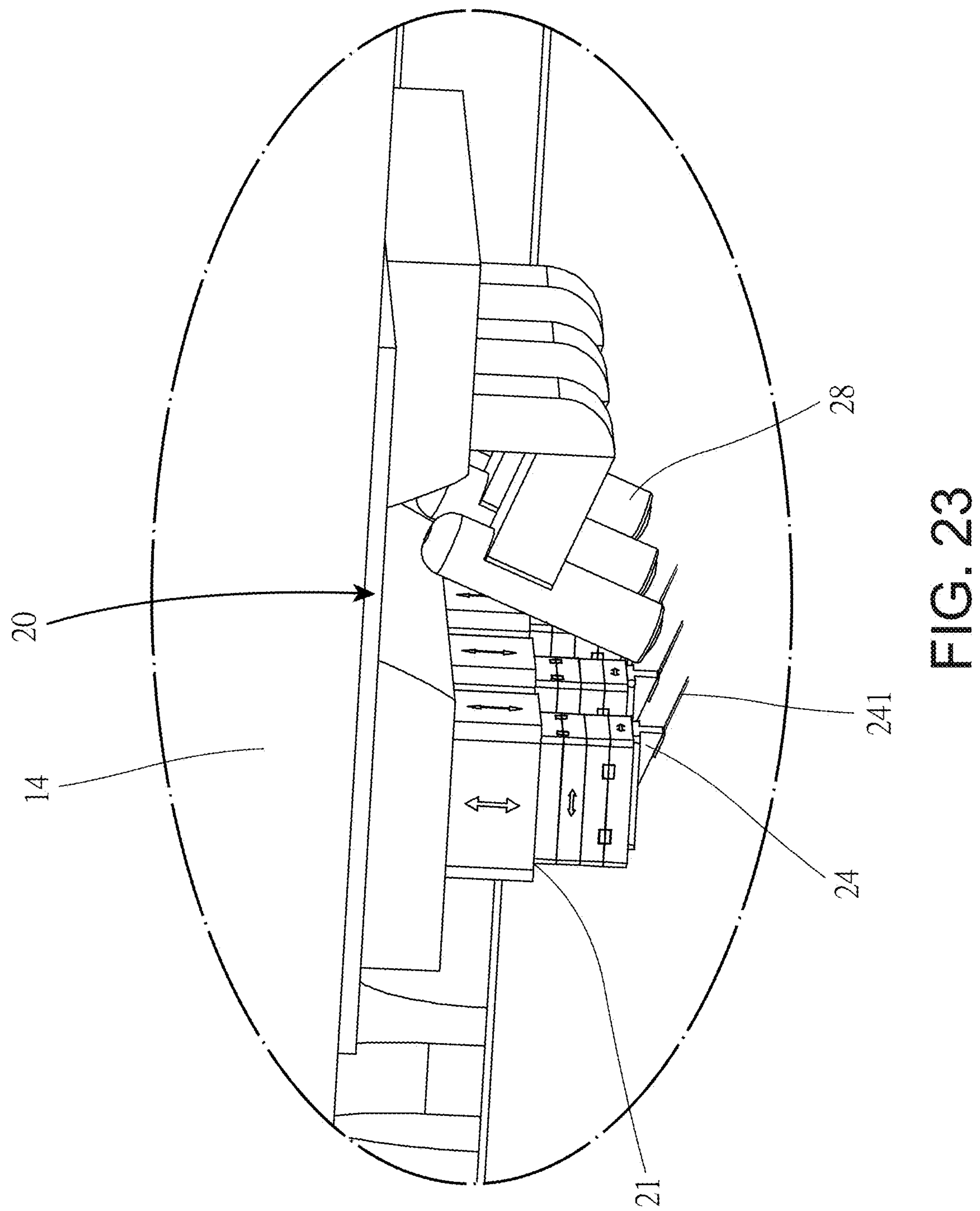
FIG. 23 is a detailed view of the area in oval H of FIG. 22.
Figure 24:
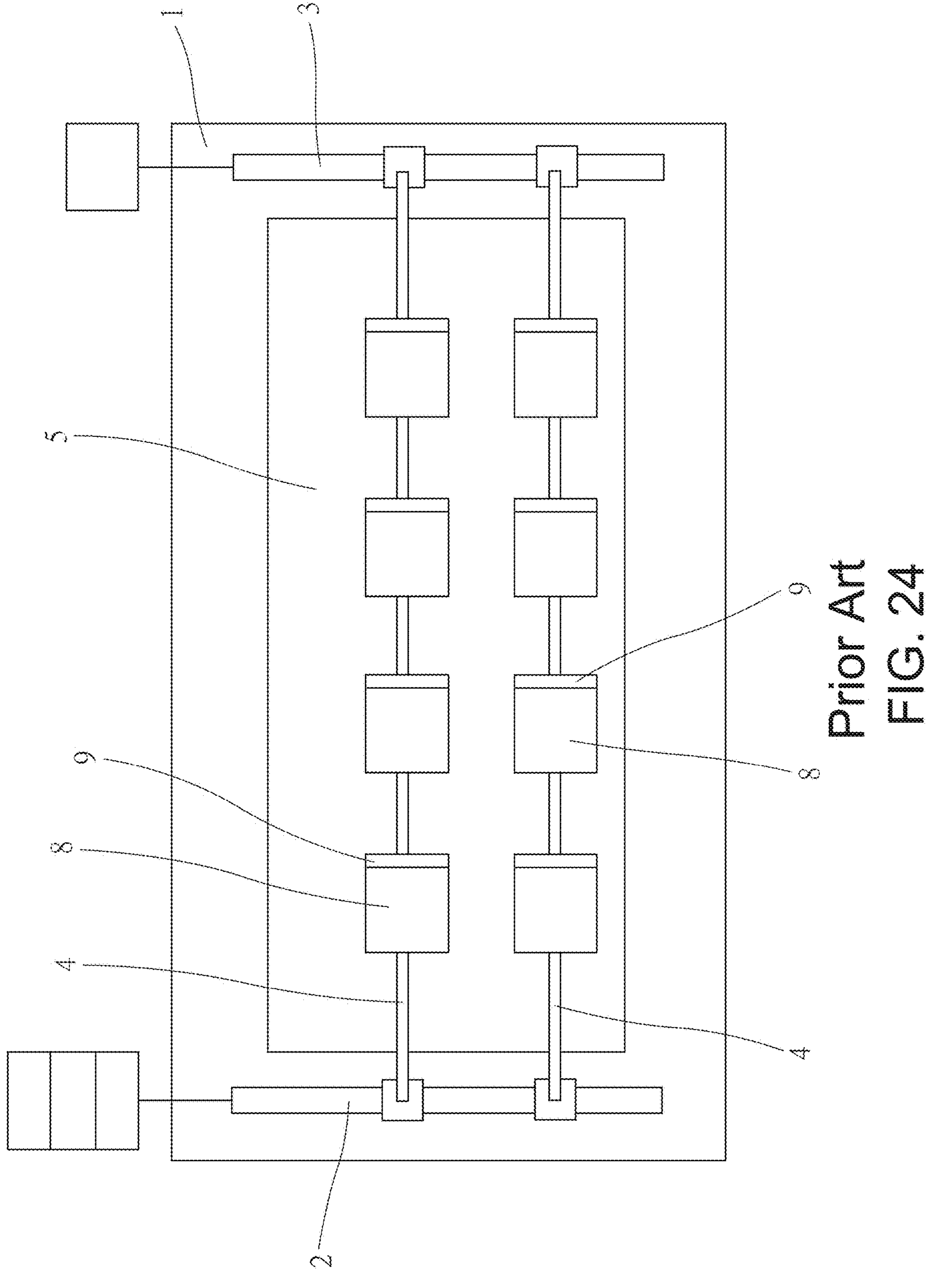
FIG. 24 is a top plan view of a conventional wafer probing apparatus.
Figure 25:
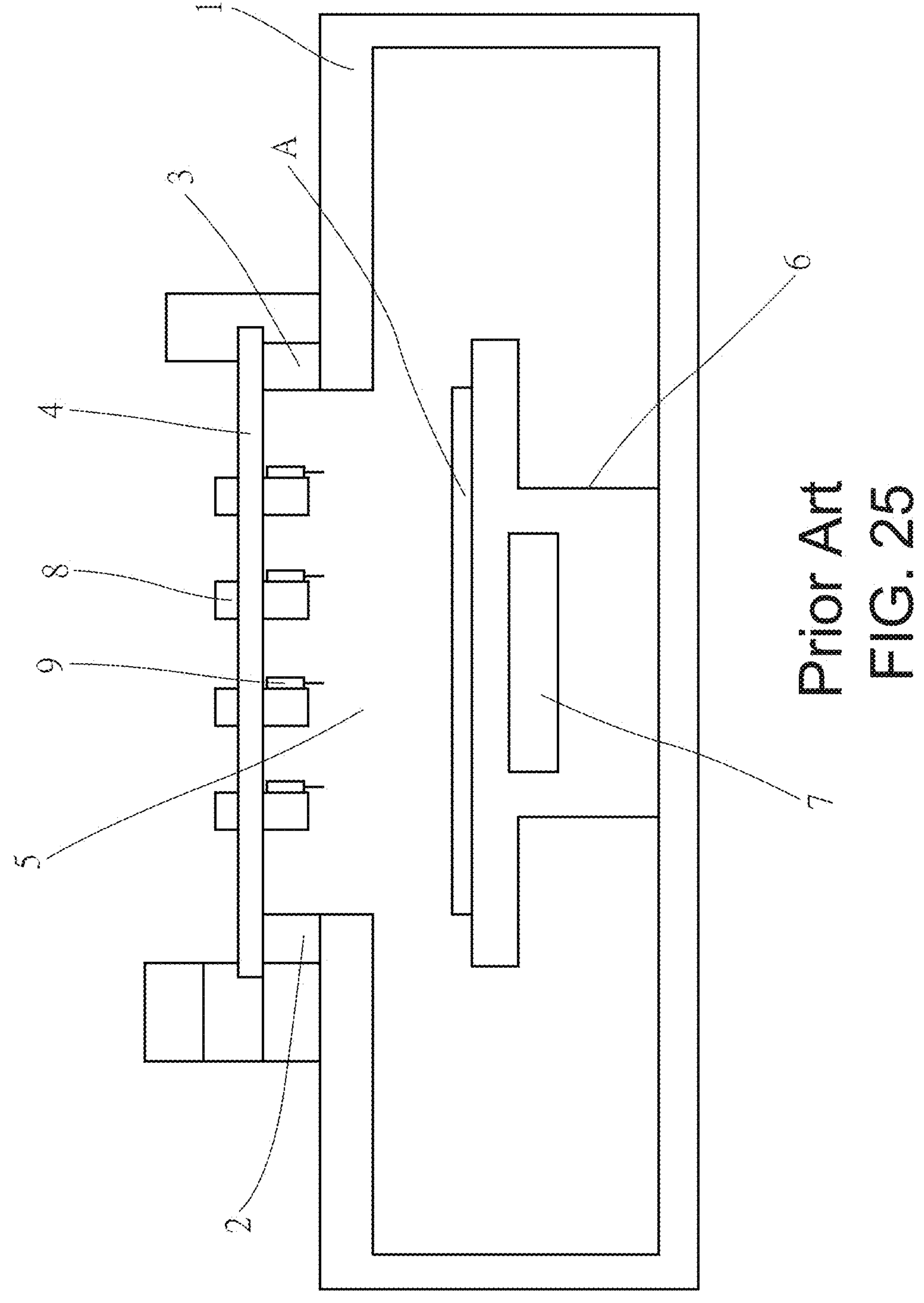
FIG. 25 is a longitudinal sectional view of the wafer probing apparatus in FIG. 24.

Referring to FIGS. 22 to 23, a wafer probing apparatus 100 in accordance with an eleventh preferred embodiment of the invention is shown. The characteristics of the eleventh preferred embodiment are substantially the same as that of the first preferred embodiment except the following: the probe card positioning module 20 includes a plurality of image capture devices 28 provided close to the needle alignment devices 21. The optical images or thermal images provided by the image capture devices 28 can be used to adjust probe needle alignment in the initial stage of the wafer test process. The optical images or thermal images are also used to analyze and correct the problem of probe positioning drift in real time during the wafer test.

While the invention has been described in terms of preferred embodiments, those skilled in the art will recognize that the invention can be practiced with modifications within the spirit and scope of the appended claims.

What is claimed is:

1. A wafer probing apparatus, comprising:

a wafer probe station including a wafer chuck and a chuck movement device disposed under the wafer chuck and configured to move the wafer chuck, wherein a wafer is configured to adhere to the wafer chuck;

a lifting mechanism;

a support frame connected to the lifting mechanism;

at least one probe card positioning module disposed on the support frame, each of the at least one probe card positioning module including at least one needle alignment device, each of the at least one needle alignment device having at least one probe card with at least one probe needle; and a mechatronics control system electrically connected to the at least one probe card positioning module, wherein the lifting mechanism is configured to position the support frame above the wafer probe station, and to raise and lower the support frame and the at least one probe card positioning module relative to the wafer chuck.

2. The wafer probing apparatus of claim 1, further comprising a heating device disposed in the wafer chuck, wherein the chuck movement device is configured to move the wafer chuck in a three-dimensional space.

3. The wafer probing apparatus of claim 1, wherein the at least one needle alignment device includes at least one electric fine-tuning device, the at least one probe card and the at least one electric fine-tuning device are joined directly or indirectly, each of the at least one electric fine-tuning device is electrically connected to the mechatronics control system, and the mechatronics control system controls the at least one needle alignment device which in turn moves, rotates or tilts the at least one probe card.

4. The wafer probing apparatus of claim 3, wherein each of the at least one electric fine-tuning device is a piezo stage, a piezo actuator, a piezo motor, a step motor, a servo motor, a voice coil motor, or a Stewart platform.

5. The wafer probing apparatus of claim 1, wherein the at least one needle alignment device includes at least one manual fine-tuning device, the at least one probe card and the at least one manual fine-tuning device are joined directly or indirectly, and the at least one probe card moves, rotates, or tilts by operating the at least one manual fine-tuning device.

6. The wafer probing apparatus of claim 1, wherein the at least one probe card positioning module includes at least one probing rail and at least one probing slide slidably disposed on the at least one probing rail respectively, and the at least one needle alignment device is disposed on the at least one probing slide.

7. The wafer probing apparatus of claim 6, wherein each of the at least one probing slide is electrically connected to the mechatronics control system, and the mechatronics control system controls the at least one probing slide which in turn moves along the at least one probing rail.

8. The wafer probing apparatus of claim 6, further comprising a drive unit disposed at one side of the at least one probing rail, wherein the drive unit is electrically connected to the mechatronics control system, and the at least one probing slide is activated by the drive unit to move along the at least one probing rail.

9. The wafer probing apparatus of claim 6, further comprising a manual device disposed at one side of the at least one probing rail, wherein the manual device moves the at least one probing slide on the at least one probing rail.

10. The wafer probing apparatus of claim 6, further comprising an auxiliary fastener disposed at a lower portion of one side of the at least one needle alignment device, wherein the at least one probe card is provided with the auxiliary fastener.

11. The wafer probing apparatus of claim 6, further comprising at least one image capture device disposed at one side of the at least one probing slide.

12. The wafer probing apparatus of claim 6, further comprising:

at least one image capture device;

at least one auxiliary rail disposed on the support frame and spaced from the at least one probing rail by a predetermined distance; and at least one imaging positioning slide disposed on each of the at least one auxiliary rail, wherein the at least one image capture device is disposed on the at least one imaging positioning slide.

13. The wafer probing apparatus of claim 12, wherein each of the at least one imaging positioning slide is electrically connected to the mechatronics control system, and the mechatronics control system activates the at least one imaging positioning slide to move along the at least one auxiliary rail.

14. The wafer probing apparatus of claim 1, wherein the lifting mechanism has either a split design to dispose at one side of the wafer probe station or a unitary design so that the lifting mechanism and the wafer probe station are joined.

15. A wafer probing apparatus, comprising:

a wafer probe station including a wafer chuck and a chuck movement device disposed under the wafer chuck and configured to move the wafer chuck wherein a wafer is configured to adhere to the wafer chuck;

a lifting mechanism;

a support frame connected to the lifting mechanism;

at least one probe card positioning module disposed on the support frame, each of the at least one probe card positioning module including at least one needle alignment device, each of the at least one needle alignment device having at least one probe card with at least one probe needle;

a mechatronics control system electrically connected to the at least one probe card positioning module; and an auxiliary fastener disposed at a lower portion of one side of the at least one needle alignment device, wherein the at least one probe card is provided with the auxiliary fastener.

16. A wafer probing apparatus, comprising:

a wafer probe station including a wafer chuck and a chuck movement device disposed under the wafer chuck and configured to move the wafer chuck wherein a wafer is configured to adhere to the wafer chuck;

a lifting mechanism;

a support frame connected to the lifting mechanism;

at least one probe card positioning module disposed on the support frame, each of the at least one probe card positioning module including at least one needle alignment device, each of the at least one needle alignment device having at least one probe card with at least one probe needle; and a mechatronics control system electrically connected to the at least one probe card positioning module, wherein the at least one probe card positioning module further comprises at least one image capture device, and wherein the at least one image capture device is disposed adjacent to the at least one needle alignment device.

* * * * *